(12) United States Patent
Akhtar et al.

(10) Patent No.: US 7,936,229 B2
(45) Date of Patent: May 3, 2011

(54) LOCAL OSCILLATOR INCORPORATING PHASE COMMAND EXCEPTION HANDLING UTILIZING A QUADRATURE SWITCH

(75) Inventors: Siraj Akhtar, Richardson, TX (US); Mehmet Ipek, Dallas, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 781 days.

(21) Appl. No.: 11/852,939

(22) Filed: Sep. 10, 2007

(65) Prior Publication Data

US 2008/0002788 A1 Jan. 3, 2008

Related U.S. Application Data

(63) Continuation-in-part of application No. 11/203,019, filed on Aug. 11, 2005, now Pat. No. 7,532,679.

(60) Provisional application No. 60/825,838, filed on Sep. 15, 2006.

(51) Int. Cl.
*H03B 27/00* (2006.01)
*H03C 1/00* (2006.01)
*H03C 3/00* (2006.01)
*H03L 7/00* (2006.01)

(52) U.S. Cl. ............... 332/145; 331/1 A; 331/17; 331/45

(58) Field of Classification Search .................. 332/144, 332/145; 331/1 A, 16–18, 25, 45
See application file for complete search history.

(56) References Cited

U.S. PATENT DOCUMENTS

| | | | |
|---|---|---|---|
| 5,686,864 A | * | 11/1997 | Martin et al. .................. 331/1 A |
| 6,809,598 B1 | | 10/2004 | Staszewski et al. |
| 2006/0033582 A1 | | 2/2006 | Staszewski et al. |
| 2006/0038710 A1 | | 2/2006 | Staszewski et al. |

OTHER PUBLICATIONS

S. Akhtar et al., "Quad Band Digitally Controlled Oscillator for WCDMA Transmitter in 90nm CMOS," IEEE 206 CUstom Integrated Circuits Conference (CICC), Jul. 2006, pp. 129-132.
S. Akhtar et al., "Analog Path for Triple band WCDMA Polar Modulated Transmitter in 90nm CMOS," IEEE RFIC Symposium, Sep. 2007, pp. 185-188.
U.S. Appl. No. 11/203,019, filed Aug. 11, 2005, Staszewski et al.
U.S. Appl. No. 11/844,453, filed Aug. 24, 2007, Lerner et al.

\* cited by examiner

*Primary Examiner* — David Mis
(74) *Attorney, Agent, or Firm* — Ronald O. Neerings; Wade James Brady, III; Frederick J. Telecky, Jr.

(57) ABSTRACT

A novel and useful apparatus for and method of local oscillator generation employing an exception handling mechanism that permits an oscillator having a limited modulation range to handle the large modulation ranges demanded by modern wideband wireless standards such as 3G WCDMA, etc. A controllable oscillator generates an RF signal having four quadrature phases in accordance with an input command signal. An exception handler compares the frequency command information against a threshold. If it exceeds the threshold a phase jump and a residue frequency command are generated. The residue frequency command is input to an oscillator which is operative to generate an RF signal having four quadrature phases. The phase jump is input to a quadrature switch which functions to select one of the four quadrature phase signals as the output RF signal which is then fed to a digital power amplifier.

58 Claims, 16 Drawing Sheets

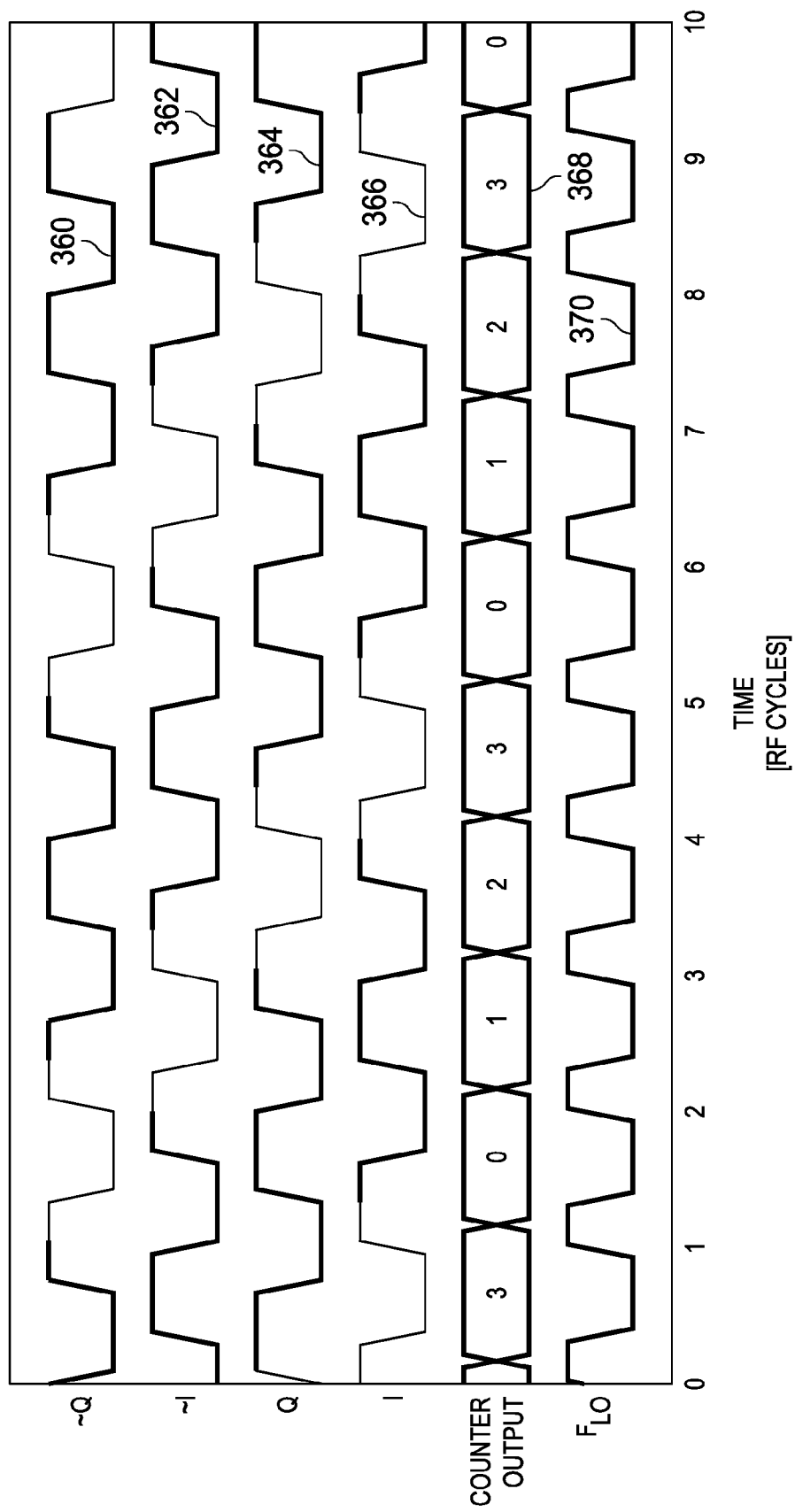

LOCAL OSCILLATOR INCORPORATING PHASE COMMAND EXCEPTION HANDLING UTILIZING A QUADRATURE SWITCH

REFERENCE TO PRIORITY APPLICATIONS

This application is a continuation-in-part of U.S. application Ser. No. 11/203,019, filed Aug. 11, 2005, now U.S. Pat. No. 7,532,679 entitled "Hybrid Polar/Cartesian Digital Modulator," and claims priority to U.S. Provisional Application Ser. No. 60/825,838, filed Sep. 15, 2006, entitled "Software Reconfigurable All Digital Phase Lock Loop", both of which are incorporated herein by reference in their entirety.

FIELD OF THE INVENTION

The present invention relates to the field of data communications and more particularly relates to a local oscillator (LO) incorporating a phase command exception handling mechanism.

BACKGROUND OF THE INVENTION

With the explosive growth of the cellular phone industry, the need has arisen to reduce cost and power consumption of mobile handsets. To keep costs down, the entire radio, including memory, application processor, digital baseband processor, analog baseband and RF circuits, would ideally be all integrated onto a single silicon die with a minimal count of external components. The use of low-voltage deep submicron CMOS processes allows for an unprecedented degree of scaling and integration in digital circuitry, but complicates implementation of traditional RF circuits. Furthermore, any mask adders for RF/analog circuits are not acceptable from a fabrication cost standpoint.

Consequently, a strong incentive has arisen to find digital architectural solutions to the RF functions. Areas currently in focus are phase/frequency and amplitude modulations of an RF carrier realized using a digitally-controlled oscillator (DCO) and a digitally-controlled power amplifier (DPA) circuits, respectively. They are digitally-intensive equivalents of the conventional voltage-controlled oscillator (VCO) and power amplifier (PA) driver circuits. Due to the fine feature size and high switching speed of the modern CMOS technology, the respective digital-to-frequency conversion (DFC) and digital-to-RF-amplitude conversion (DRAC) transfer functions could be made very linear and of high dynamic range.

A block diagram illustrating an example prior art polar transmitter is shown in FIG. 1. The polar transmitter, generally referenced 10, comprises CORDIC and polar signal processing block 12, digital to frequency conversion block (DFC) 14 and Digital to RF amplitude conversion block (DRAC) 16. The DFC 14 comprises a modulator 22 and digitally controlled oscillator (DCO) 24. The DRAC 16 comprises a modulator 18 and digital power amplifier (DPA) 20.

The I and Q samples of the Cartesian coordinate system generated in a digital baseband (DBB) are converted through CORDIC algorithm 12 into amplitude and phase samples of the polar coordinate system. The phase is then differentiated to obtain frequency deviation. The polar signals are then conditioned through signal processing to sufficiently increase the sampling rate in order to reduce the quantization noise density and lessen the effects of the modulating spectrum replicas. The frequency deviation output signal is fed into the DCO based DFC 14, which produces a phase modulated (PM) digital carrier $$y_{PM}(t)=\text{sgn}(\cos(\omega_0 t+\theta[k])) \quad (1)$$

where $\text{sgn}(x)=1$ for $x \geq 0$ and $\text{sgn}(x)=-1$ for $x<0$, $\omega_0=2\pi f_0$ is the angular RF carrier frequency, and $\theta[k]$ is the modulating baseband phase of the $k^{th}$ sample. The phase $\theta(t)=\int_{-\infty}^{t} f(t)dt$ is an integral of frequency deviation, where $t=k \cdot T_0$ with $T_0$ being the sampling period.

The amplitude modulation (AM) signal controls the envelope of the phase-modulated carrier by means of the DPA based DRAC 16. Higher-order harmonics of the digital carrier are filtered out by a matching network so that the sgn( ) operator is dropped. The composite DPA output comprises the desired RF output spectrum.

$$y_{RF}(t)=a[k] \cdot \cos(\omega_0 t+\theta[k]) \quad (2)$$

where, $a[k]$ is the modulating baseband amplitude of the $k^{th}$ sample.

While digital polar modulated transmitters have been demonstrated for GSM, GPRS, EDGE (GGE), their usage for 3G (WCDMA) and other wideband wireless standards remains a daunting task. Polar modulation relies on splitting the digital IQ baseband signal into a phase (i.e. frequency) and amplitude bit stream. The phase signal θ(or differentiated phase signal ($f=\Delta\theta/\theta t$) ) is used to directly modulate a digitally controlled oscillator (DCO), the output of which is then combined with the amplitude signal ρ in a Digital Power Amplifier (DPA). The θ (or $f=\Delta\theta/\Delta t$) component generated when passing the 3.96 MHz WCDMA IQ signal through a CORDIC spreads significantly due to the nonlinear (i.e. arctan) operation. The resulting signal is no longer band limited and thus theoretically infinite modulation of the oscillator is needed to represent this phase signal. Although, in a discrete time system such as this, the maximum frequency deviation will be limited to the sampling rate, it is still in the order of tens of MHz as shown in FIG. 2. Any truncation in phase data will degrade EVM. Tight modulation resolution has to be maintained in order to keep the frequency quantization noise much lower than electronic DCO phase noise.

Statistically, it can be shown that most of this signal can be represented in a bandwidth that is 100 times the signal bandwidth. This bandwidth, however, is too large a modulation range for a single oscillator (i.e. DCO) to handle while still providing the needed granularity (i.e. quantization step size, phase noise, etc.) and frequency coverage to span all frequency bands, including the typical bands of GSM-EU, GSM-US, PCS, DCS and IMT2K. Since the DCO modulation range is limited, phase data is truncated resulting in a severely degraded error vector magnitude (EVM).

This is further exacerbated by the fact that the DCO typically operates at 2× (for high frequency bands) or 4× (for low frequency bands) the actual desired output channel frequency. This implies that the DCO modulation range must be at least 4× the needed range. In practice, however, the modulation range must be even greater in order to compensate for coarse tuning step size, process, voltage and temperature (PVT) variations, etc.

Since the bandwidth requirements for existing GGE (i.e. 2G and 2.5G) polar transmitters are much smaller than that required for WCDMA and can thus be easily handled by the DCO. Therefore, a solution to the bandwidth problem described above, is to use multiple DCO circuits, one for each frequency band, corresponding to four DCO circuits. A disadvantage of this solution is that since the DCO circuit incorporates a large integrated circuit inductor, significant area would be consumed. Even if such a solution was constructed, it is not certain whether (1) the full modulation range (i.e. fine frequency step) could be achieved while keeping the DCO phase noise within specification or (2) whether the EVM would be degraded and compromised.

Another problem associated with highly integrated transceivers is injection pulling of the RF oscillator by the strong RF output if there is a small, but non-zero, frequency difference between the aggressor's (PPA or PA output signal) harmonic and the victim (RF oscillator's LC tank). The small frequency difference could be due, for example, to the AM modulation part of a polar transmitter, which performs both AM and PM/FM modulations. If, however, the aggressor harmonic frequency does not fall into the vicinity of the victim's critical frequency (e.g., resonating frequency of the LC tank), then the injection pulling will not be significant.

It is thus desirable to have a mechanism that overcomes the disadvantage of the prior art techniques. The mechanism should preferably be implementable as a simple, all digital implementation and be capable of enabling a polar transmitter to be used with wideband modulation schemes. More specifically, the mechanism should enable an oscillator having a limited bandwidth to be used with large modulation ranges required by wideband modulation schemes such as 3G WCDMA. In addition, in order to further avoid the DCO frequency pulling by the transmitter RF signal, the mechanism should preferably oscillate at a rational RF frequency multiplier (n/m, such as 4/3 or 3/4 of the RF frequency) so as to avoid frequency pulling.

SUMMARY OF THE INVENTION

The present invention is a novel and useful apparatus for and method of local oscillator (LO) generation employing an exception handling mechanism that permits an oscillator having a limited modulation range to handle the large modulation ranges demanded by modern wideband wireless standards such as 3G WCDMA, etc.

The novel LO exception handling mechanism described herein are suitable for use in any application requiring the generation of a wideband signal from an oscillator having a limited modulation range. An example application is provided of a single chip radio, e.g., WCDMA, etc., that integrates the RF circuitry with the digital base band (DBB) circuitry on the same die.

In operation, a frequency controlled oscillator functions to generate an RF signal having four quadrature phases in accordance with an input command signal. An exception handler intercepts the frequency command information and compares it against a threshold. If it exceeds the threshold a phase jump and a residue frequency command are generated. The residue frequency command is input to the oscillator while the phase jump is input to a quadrature switch. The switch functions to select one of the four quadrature phase signals as the output RF signal that is then fed to the digital power amplifier (DPA). The DPA amplitude modulates the output RF signal in accordance with an amplitude command signal.

Advantages of the LO exception handling mechanism of the present invention include (1) permitting the use of a single oscillator having relaxed modulation range requirements; (2) the fast phase jump and residue correction provides for an elegant implementation requiring negligible chip area and power consumption; (3) depending on the implementation, the quadrature switch makes use of a switched inverter that is similar to what is already used in the frequency divider portion of the circuit; (4) the switch is sized and constructed so as to have a negligible effect on the phase noise; and (5) a single DCO can span four bands (IMT2K, PCS/DCS, GSM-EU/US, TDSCDMA).

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the present invention, an apparatus for generating polar modulation, comprising an oscillator operative to generate a radio frequency (RF) signal having quadrature phases in accordance with a residue tuning command, exception handling means coupled to the oscillator and operative to generate the residue tuning command and a phase jump in accordance with a frequency deviation request and four switched inverter buffers, each switched inverter buffer coupled to one of the quadrature phases and operative to output one of the quadrature phases in accordance with the phase jump.

There is also provided in accordance with the present invention, an apparatus for generating polar modulation, comprising an oscillator operative to generate a radio frequency (RF) signal having a plurality of phases in accordance with a residue tuning command, exception handling means coupled to the oscillator and operative to generate the residue tuning command and a phase jump in accordance with a frequency deviation request and a switch for receiving the plurality of phases and operative to output one of the phases in accordance with the phase jump.

There is further provided in accordance with the present invention, a method of polar modulation, the method comprising the steps of first generating a phase jump and corresponding residue frequency deviation command if a frequency deviation request exceeds a threshold, second generating a radio frequency (RF) signal having an output frequency with a plurality of phases in response to the residue frequency deviation command and selecting one of the phases in accordance with the phase jump.

There is also provided in accordance with the present invention, a method of polar modulation, the method comprising the steps of receiving I and Q input signals representing data to be transmitted, first generating a frequency command and an amplitude command in response to the I and Q input signals, determining a metric as a function of the frequency command or the amplitude command, second generating a residue tuning command and a phase jump if the metric exceeds the threshold, providing a frequency synthesizer operative to generate a plurality of phase RF signal having a frequency in accordance with the residue tuning command and selecting one of the phases as an output signal in accordance with the phase jump.

There is further provided in accordance with the present invention, a polar radio frequency (RF) transmitter comprising means for generating a frequency command and an amplitude command in response to I and Q input signals representing data to be transmitted, an exception handler operative to generate a residue frequency command and a phase jump in accordance with the frequency command, a frequency synthesizer operative to generate an RF signal comprising quadrature phases and having a frequency in accordance with the residue frequency command and a frequency reference input, a switch for receiving the quadrature phases and operative to output one of the quadrature phases in accordance with the phase jump and a digital power amplifier (DPA) operative to receive the single quadrature phase output of the switch and to generate a modulated RF output signal in proportion to the amplitude code.

There is further provided in accordance with the present invention, a radio comprising a transmitter, the transmitter comprising an oscillator operative to generate a radio frequency (RF) signal in accordance with a residue tuning command, the RF signal comprising a plurality of phases, exception handling means coupled to the oscillator and operative to generate the residue tuning command and a phase jump in accordance with a frequency deviation request, a switch for receiving the plurality of phases and operative to output one of the multiple phases in accordance with the phase jump, a receiver and a baseband processor coupled to the transmitter and the receiver.

There is also provided in accordance with the present invention, a method of polar modulation for use in a transmitter comprising an oscillator generating a radio frequency (RF) signal having M phases, the method comprising the steps of activating a phase jump when the oscillator is commanded to modulate beyond its effective range and requesting a residue phase modulation from the DCO.

There is further provided in accordance with the present invention, an apparatus for generating polar modulation, comprising an oscillator operative to generate a quadrature clock having an output frequency in accordance with an oscillator input, a multiplexer coupled to receive the quadrature clock and operative to output one of phases of the quadrature clock as an output signal in accordance with a select control input, exception handling means operative to generate a residue tuning command coupled to the oscillator input and to generate a phase jump control signal in accordance with a frequency deviation request, a modulo-4 counter operative to generate a counter output, wherein the counter output adapted to cause the multiplexer to cycle through the phases of the quadrature clock and means for combining the phase jump control signal and the counter output to generate the select control input therefrom.

BRIEF DESCRIPTION OF THE DRAWINGS

The invention is herein described, by way of example only, with reference to the accompanying drawings, wherein:

FIG. 16 is a timing diagram illustrating the various time domain traces for the local oscillator generator shown in FIG. 15.

DETAILED DESCRIPTION OF THE INVENTION

Notation Used Throughout

Figure 1:
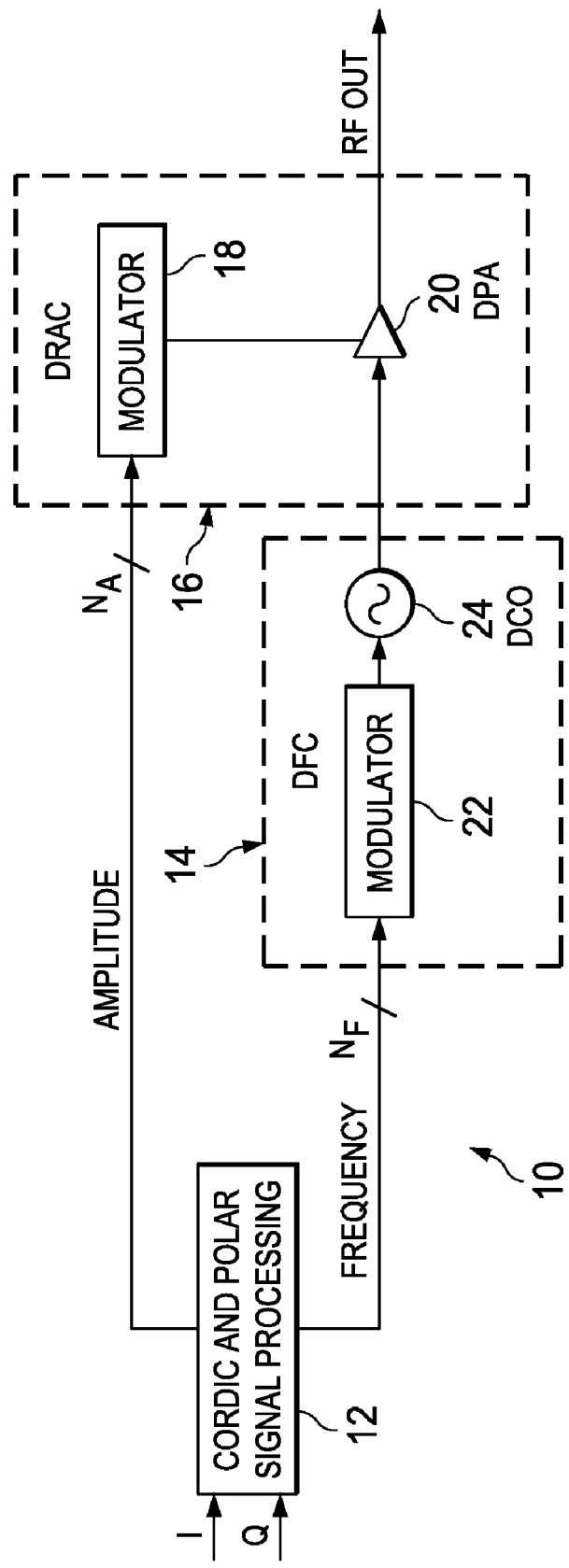
FIG. 1 is a block diagram illustrating an example prior art polar transmitter.
Figure 2:
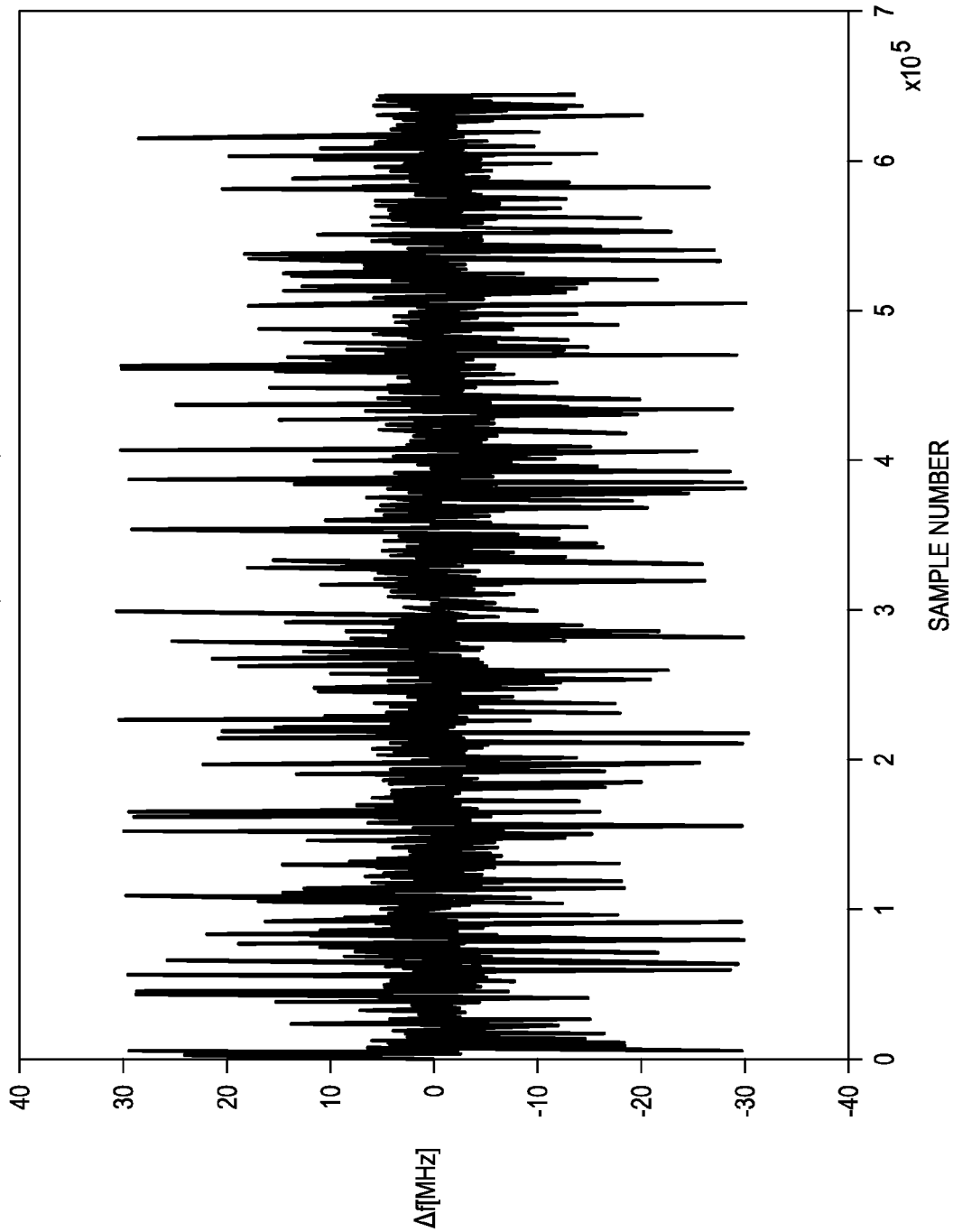
FIG. 2 is a graph illustrating the frequency deviation of a typical WCDMA modulation.

The following notation is used throughout this document.

| Term | Definition |
| --- | --- |
| AC | Alternating Current |
| ACL | Asynchronous Connectionless Link |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| AWS | Advanced Wireless Services |
| BIST | Built-in Self Test |
| BMP | Windows Bitmap |
| BPF | Band Pass Filter |
| CMOS | Complementary Metal Oxide Semiconductor |
| CPU | Central Processing Unit |
| CU | Control Unit |
| CW | Continuous Wave |
| DAC | Digital to Analog Converter |
| dB | Decibel |
| DBB | Digital Baseband |
| DC | Direct Current |
| DCO | Digitally Controlled Oscillator |
| DCS | Digital Cellular System |
| DCXO | Digitally Controlled Crystal Oscillator |
| DFC | Digital-to-Frequency Conversion |
| DPA | Digitally Controlled Power Amplifier |
| DPPA | Digital Pre-Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EEPROM | Electrically Erasable Programmable Read Only Memory |
| EPROM | Erasable Programmable Read Only Memory |
| eSCO | Extended Synchronous Connection-Oriented |
| EVM | Error Vector Magnitude |
| FCC | Federal Communications Commission |
| FCW | Frequency Command Word |
| FIB | Focused Ion Beam |
| FM | Frequency Modulation |
| FPGA | Field Programmable Gate Array |
| FTW | Frequency Tuning Word |
| GMSK | Gaussian Minimum Shift Keying |
| GPS | Global Positioning System |

-continued

| Term | Definition |
| --- | --- |
| GSM | Global System for Mobile communications |
| HB | High Band |
| HDL | Hardware Description Language |
| HFP | Hands Free Protocol |
| I/F | Interface |
| IC | Integrated Circuit |
| IEEE | Institute of Electrical and Electronics Engineers |
| IIR | Infinite Impulse Response |
| JPG | Joint Photographic Experts Group |
| LAN | Local Area Network |
| LB | Low Band |
| LDO | Low Drop Out |
| LO | Local Oscillator |
| LPF | Low Pass Filter |
| MAC | Media Access Control |
| MAP | Media Access Protocol |
| MBOA | Multiband OFDM Alliance |
| MIM | Metal Insulator Metal |
| Mod | Modulo |
| MOS | Metal Oxide Semiconductor |
| MP3 | MPEG-1 Audio Layer 3 |
| MPG | Moving Picture Experts Group |
| MUX | Multiplexer |
| NZIF | Near Zero IF |
| OFDM | Orthogonal Frequency Division Multiplexing |
| OTW | Oscillator Tuning Word |
| PA | Power Amplifier |
| PAN | Personal Area Network |
| PC | Personal Computer |
| PCI | Personal Computer Interconnect |
| PCS | Personal Communications Service |
| PD | Phase Detector |
| PDA | Personal Digital Assistant |
| PE | Phase Error |
| PHE | Phase Error |
| PLL | Phase Locked Loop |
| PM | Phase Modulation |
| PPA | Pre-Power Amplifier |
| QoS | Quality of Service |
| RAM | Random Access Memory |
| RF | Radio Frequency |
| RFBIST | RF Built-in Self Test |
| RMS | Root Mean Squared |
| ROM | Read Only Memory |
| SAM | Sigma-Delta Amplitude Modulation |
| SAW | Surface Acoustic Wave |
| SCO | Synchronous Connection-Oriented |
| SEM | Spectral Emission Mask |
| SIM | Subscriber Identity Module |
| SoC | System on Chip |
| SRAM | Static Read Only Memory |
| SYNTH | Synthesizer |
| TDC | Time to Digital Converter |
| TDD | Time Division Duplex |
| TV | Television |
| UGS | Unsolicited Grant Services |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMAN | Wireless Metropolitan Area Network |
| WMV | Windows Media Video |
| WPAN | Wireless Personal Area Network |
| XOR | Exclusive Or |
| ZIF | Zero IF |

DETAILED DESCRIPTION OF THE INVENTION

The present invention is a novel and useful apparatus for and method of local oscillator (LO) generation employing an exception handling mechanism that permits an oscillator having a limited modulation range to handle the large modulation ranges demanded by modern wideband wireless standards such as 3G WCDMA, etc. In addition, a non-harmonic frequency relationship between the DCO oscillating frequency and the RF output for the purpose of eliminating the oscillator frequency pulling could be advantageously achieved using a portion of the same hardware, thus saving power consumption and cost.

The novel LO exception handling mechanism described herein are suitable for use in any application requiring the generation of a wideband signal from an oscillator having a limited modulation range. An example application is provided of a single chip radio, e.g., WCDMA, etc., that integrates the RF circuitry with the digital base band (DBB) circuitry on the same die.

Although the LO exception handling mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations where there is a need to mitigate the frequency pulling effect of the RF output frequency on the reference frequency clock generation.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 3:
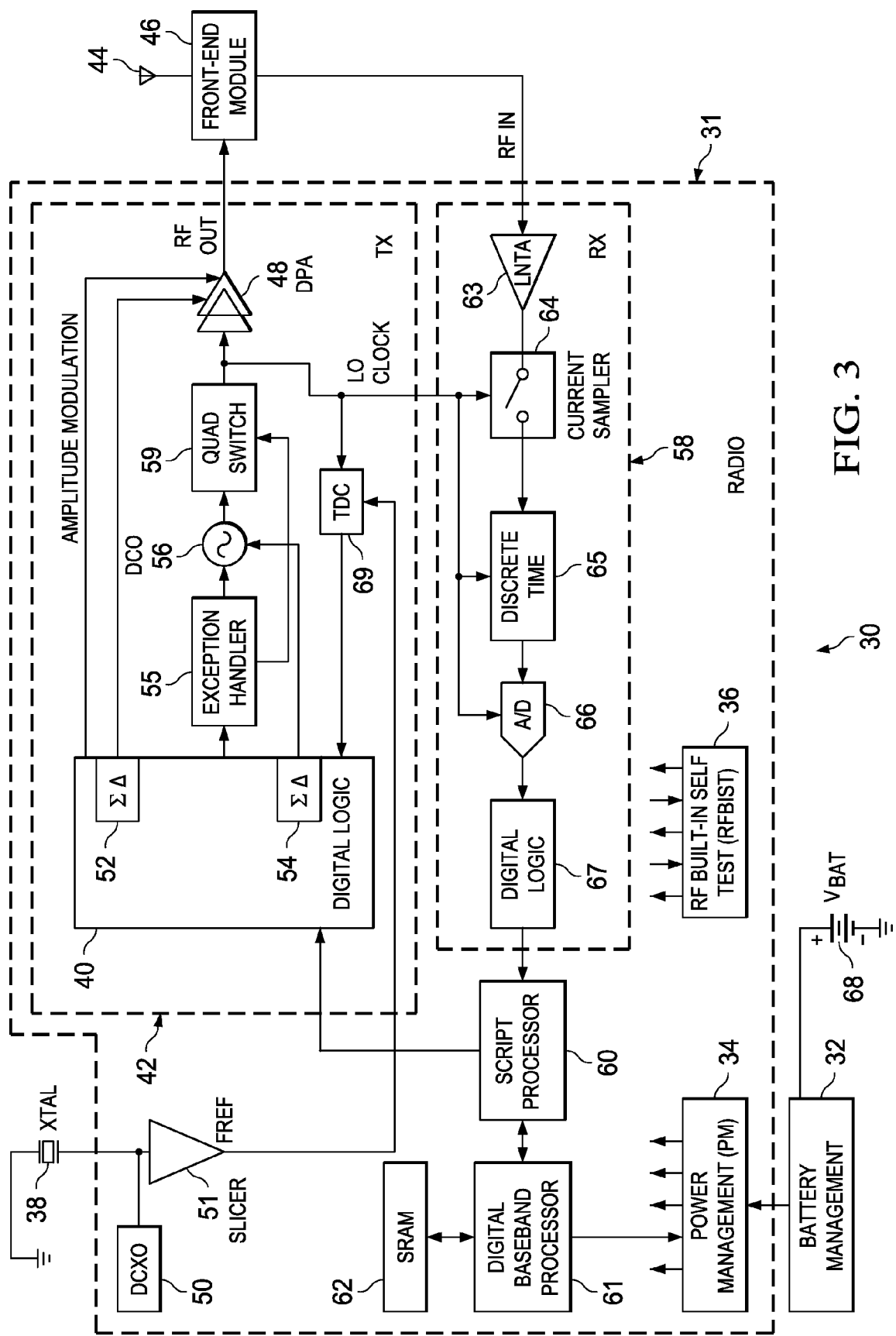
FIG. 3 is a block diagram illustrating a single chip polar transceiver radio incorporating an all-digital local oscillator based transmitter and receiver and local oscillator (LO) generation mechanism of the present invention.

A block diagram illustrating a single chip polar transceiver radio incorporating an all-digital local oscillator based transmitter and receiver and local oscillator (LO) exception handling mechanism of the present invention is shown in FIG. 3. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio, generally referenced 3, comprises a radio integrated circuit 31 coupled to a crystal 38, front end module 46 coupled to an antenna 44, and battery management circuit 32 coupled to battery 68. The radio chip 31 comprises a script processor 60, digital baseband (DBB) processor 61, memory 62 (e.g., static RAM), TX block 42, RX block 58, digitally controlled crystal oscillator (DCXO) 50, slicer 51, power management unit 34 RF built-in self test (BIST) 36. The TX block comprises high speed and low speed digital logic block 40 including $\Sigma\Delta$ modulators 52, 54, exception handler block 55, digitally controlled oscillator (DCO) 56, quadrature switch or multiplexer 59 and digitally controlled power amplifier (DPA) 48. The RX block comprises a low noise transconductance amplifier 63, current sampler 64, discrete time processing block 65, analog to digital converter (ADC) 66 and digital logic block 67.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. This architecture is also used as the foundation for a UMTS single-chip radio manufactured using a 45 nm CMOS process. The common architecture is highlighted with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution in both DCO and DCXO is achieved through high-speed $\Sigma\Delta$ dithering of its varactors. Digital logic built around the DCO realizes an all-digital PLL (ADPLL) that is used as a local oscillator for both the transmitter and receiver. The DCO generates four quadrature phase signals.

In accordance with the invention, an exception handling mechanism permits the DCO, having a limited modulation range, to handle the large modulation ranges demanded by modern wideband wireless standards such as 3G WCDMA, etc. The oscillator generates an RF signal having four quadrature phases in accordance with an input command signal. The exception handler compares the frequency command information against a threshold. If it exceeds the threshold a phase jump and a residue frequency command are generated. The residue frequency command constitutes the frequency command to the DCO. The phase jump is input to the quadrature switch 59 which functions to select one of the four quadrature phase signals to output to the DPA 48.

The exception handling mechanism also provides an option to advance or retard by 90 degrees the DCO phase on each DCO clock cycle for the purpose of offsetting the output frequency in relation to the DCO frequency such that there will be no harmonic of the output frequency falling in the vicinity of the DCO resonant frequency. This mode of operation is used to avoid injection pulling and could be turned off if only frequency modulation is used (e.g., GMSK modulation for GSM). This mechanism uses the same quadrature switch 59, which should be carefully designed for high-speed glitch-free operation of the RF signal.

The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor and/or DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (or any other desired frequency, such as 13 or 38.4 MHz) digitally controlled crystal oscillator (DCXO) 50 coupled to slicer 51. The output of the slicer is input to the TDC circuit 69.

An integrated power management (PM) system 34 is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements and implements the DPA calibration and BIST mechanism. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator," U.S. Pat. No. 6,809,598, to Staszewski et al., entitled "Hybrid Of Predictive And Closed-Loop Phase-Domain Digital PLL Architecture" and U.S. application Ser. No. 11/844,453, filed Aug. 24, 2007, entitled "Local Oscillator With Non-Harmonic Ratio Between Oscillator And RF Frequencies Using Pulse Generation And Selection," all of which are incorporated herein by reference in their entirety.

Mobile Device/Cellular Phone/PDA System

Figure 4:
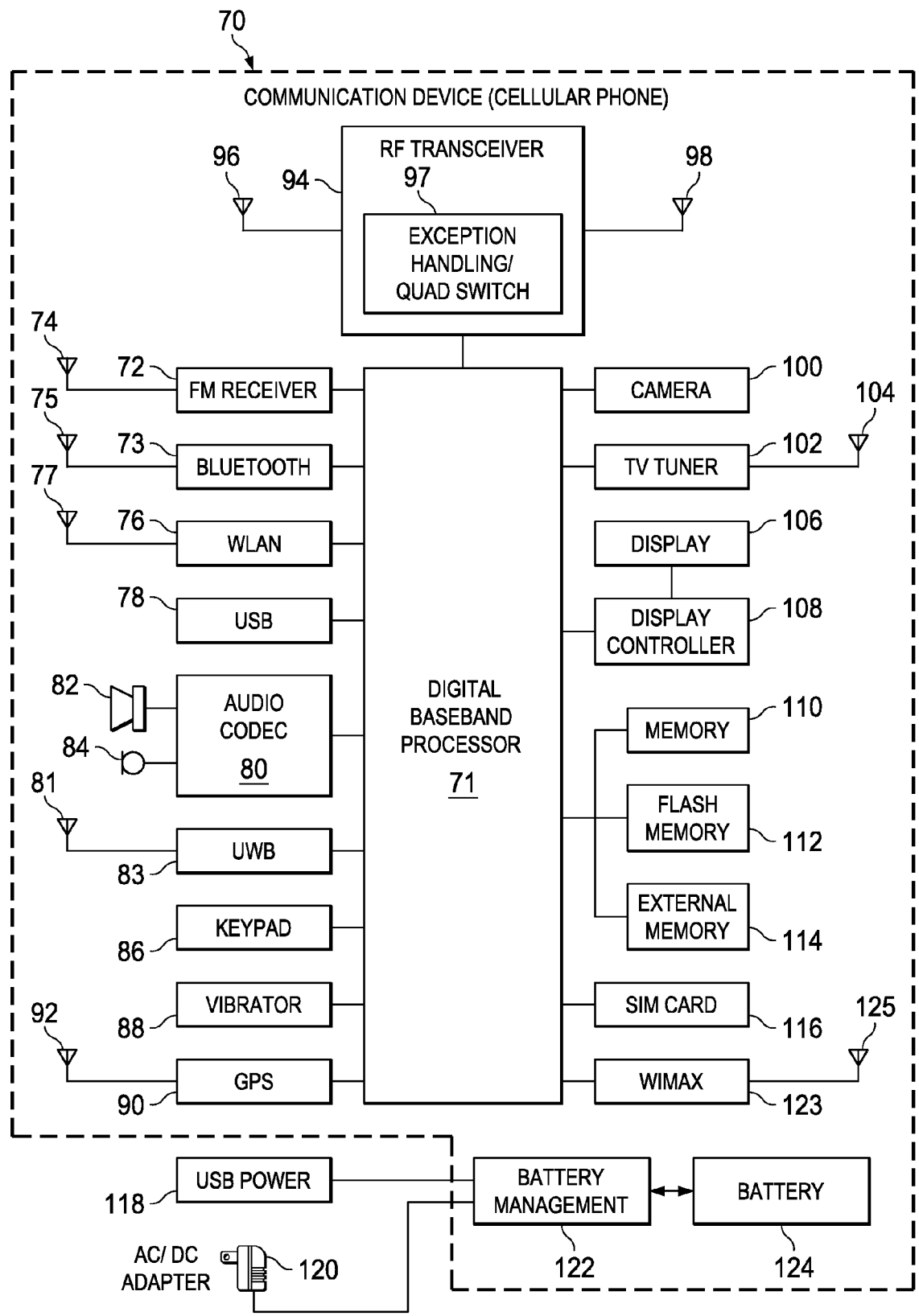
FIG. 4 is a simplified block diagram illustrating an example mobile communication device incorporating the local oscillator generation mechanism of the present invention.

A simplified block diagram illustrating an example mobile communication device incorporating the local oscillator exception handling mechanism of the present invention is shown in FIG. 4. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the LO exception handling mechanism of the present invention can be implemented in a wide variety of wireless and wired communication devices.

The cellular phone, generally referenced 70, comprises a baseband processor or CPU 71 having analog and digital portions. The basic cellular link is provided by the RF transceiver 94 and related one or more antennas 96, 98. A plurality of antennas is used to provide antenna diversity which yields improved radio performance. The cell phone also comprises internal RAM and ROM memory 110, Flash memory 112 and external memory 114.

In accordance with the invention, the RF transceiver comprises an LO exception handling block 97 that functions to effectively provide a larger DCO modulation range than the DCO is normally capable of providing on its own, as described in more detail infra. The exception handling mechanism can also be configured to perform phase rotation of the RF clock in order to avoid injection pulling. In operation, the LO generation mechanism may be implemented as hardware, as software executed as a task on the baseband processor 71 or a combination of hardware and software. Implemented as a software task, the program code operative to implement the frequency generation mechanism of the present invention is stored in one or more memories 110, 112 or 114.

Several user interface devices include microphone 84, speaker 82 and associated audio codec 80, a keypad for entering dialing digits 86, vibrator 88 for alerting a user, camera and related circuitry 100, a TV tuner 102 and associated antenna 104, display 106 and associated display controller 108 and GPS receiver 90 and associated antenna 92.

A USB interface connection 78 provides a serial link to a user's PC or other device. An FM receiver 72 and antenna 74 provide the user the ability to listen to FM broadcasts. WLAN radio and interface 76 and antenna 77 provide wireless connectivity when in a hot spot or within the range of an ad hoc, infrastructure or mesh based wireless LAN network. A Bluetooth EDR radio and interface 73 and antenna 75 provide Bluetooth wireless connectivity when within the range of a Bluetooth wireless network. Further, the communication device 70 may also comprise a WiMAX radio and interface 123 and antenna 125. SIM card 116 provides the interface to a user's SIM card for storing user data such as address book entries, etc. The communication device 70 also comprises an Ultra Wideband (UWB) radio and interface 83 and antenna 81. The UWB radio typically comprises an MBOA-UWB based radio.

Portable power is provided by the battery 124 coupled to battery management circuitry 122. External power is provided via USB power 118 or an AC/DC adapter 120 connected to the battery management circuitry which is operative to manage the charging and discharging of the battery 124.

ADPLL Polar Transmitter Incorporating LO Generation Mechanism

Figure 5:
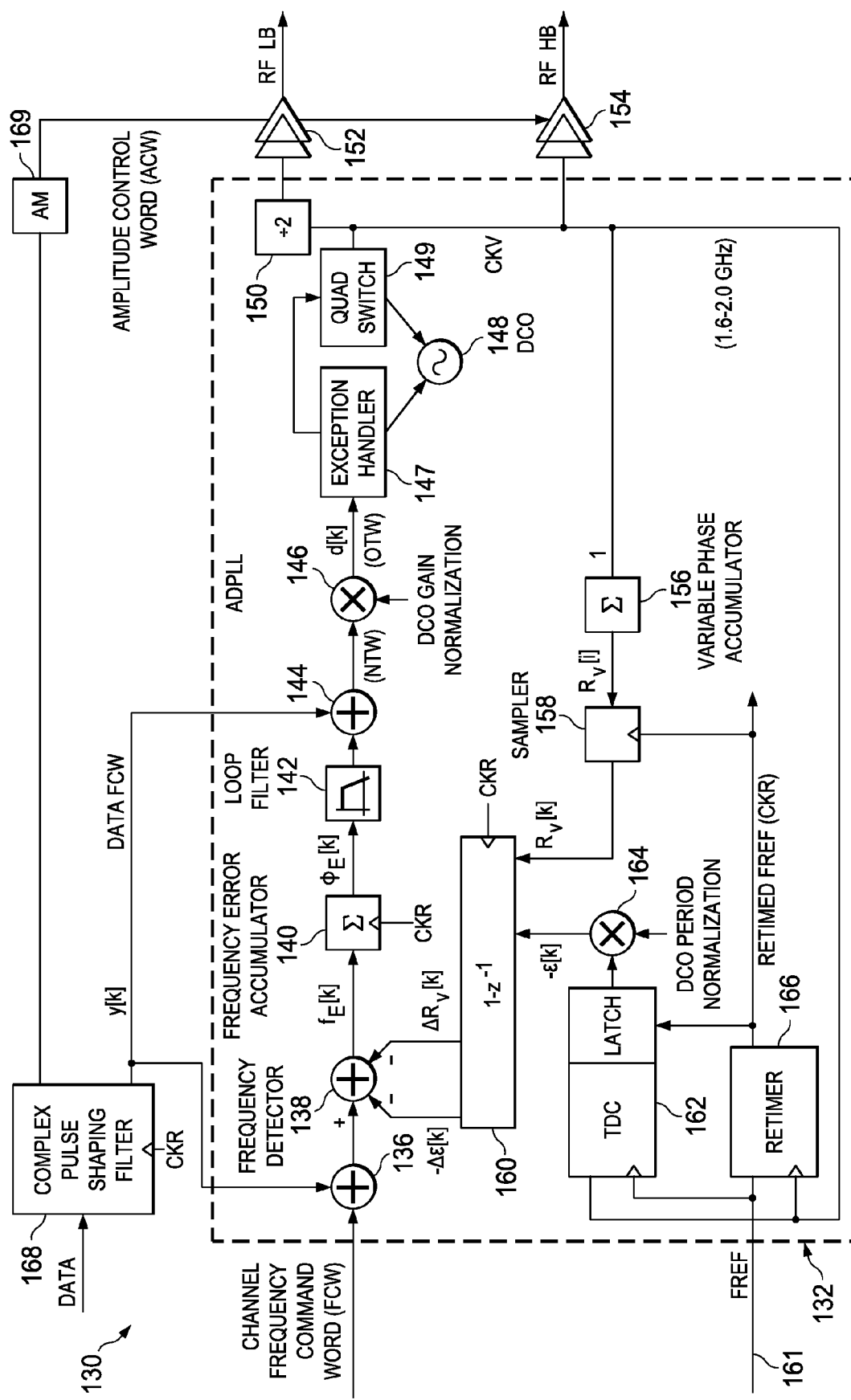
FIG. 5 is a block diagram illustrating an example all digital phase locked loop (ADPLL) incorporating the local oscillator generation mechanism of the present invention.

A block diagram illustrating an ADPLL-based polar transmitter for wireless applications incorporating the LO exception handling mechanism of the present invention is shown in FIG. 5. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The transmitter, generally referenced 130, is well-suited for a deep-submicron CMOS implementation. The transmitter comprises a complex pulse shaping filter 168, amplitude modulation (AM) block 169 and ADPLL 132. The circuit 130 is operative to perform complex modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 148, a time-to-digital converter (TDC) 162 and a non-integer LO divider 134. All inputs and outputs are digital and some even at multi-GHz frequency.

The core of the ADPLL is a digitally controlled oscillator (DCO) 148 adapted to generate the RF oscillator clock CKV. The oscillator core (not shown) could be provisioned to operate at a rational multiplier of the 1.6-2.0 GHz (e.g., 4/3) high band frequency or at a rational multiplier of the 0.8-1.0 GHz low band frequency (e.g., 4/3). The DCO core frequency is divided using a divider (not shown) for precise generation of RX quadrature signals, and for use as the transmitter's carrier frequency. It should be noted that the quadrature phase generation is commonly linked with the DCO frequency division. For example, divide-by-two provides an efficient method of generating four equally-spaced clock phases. Other methods exist, however, for generating multiple output phases that are not based on the frequency or edge division method. Note further that the inventive method performs equally well with other numbers of equally spaced clock phases, or even non-equally spaced clock phases. For example, dividing by 4 of the DCO resonant frequency would efficiently permit creation of eight equally spaced clock phases. It is appreciated that the exception handling mechanism could be adapted to operate on eight available phases or any number of multiple phases. The single DCO could be shared between transmitter and receiver and is used for both the high frequency bands (HB) and the low frequency bands (LB). The full duplex system, however, requires the use of local oscillators for the transmitter and receiver operating at different frequencies. In addition to the integer control of the DCO, at least 3-bits of the minimal varactor size used are dedicated for ΣΔ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control.

The OTW output of the gain normalization 146 is input to the exception handling block 147 which permits the DCO, having a limited modulation range, to handle the large modulation ranges demanded by modern wideband wireless standards such as 3G WCDMA, etc. The DCO 148 generates an RF signal having four quadrature phases in accordance with an input command signal. The exception handler compares the frequency command information against a threshold. If it exceeds the threshold a phase jump and a residue frequency command are generated. The residue frequency command constitutes the frequency command to the DCO. The phase jump is input to the quadrature switch or multiplexer 149 which functions to select one of the four quadrature phase signals to output. The selected quadrature phase signal is input to the RF high band Digital Pre-power amplifier (DPPA) 154. It is also input to the RF low band pre-power amplifier 152 after divide by two via divider 150.

The expected variable frequency $f_V$ (normally at the DCO output, but at the output of the quadrature switch, if it is used to perform regular phase rotation) is related to the reference frequency $f_R$ by the frequency command word (FCW).

$$FCW[k] \equiv \frac{E(f_V[k])}{f_R} \tag{3}$$

The FCW is time variant and is allowed to change with every cycle $T_R = 1/f_R$ of the frequency reference clock. With $W_F = 24$ the word length of the fractional part of FCW, the ADPLL provides fine frequency control with 1.5 Hz accuracy, according to:

$$\Delta f_{res} = \frac{f_R}{2^{W_F}} \tag{4}$$

The number of integer bits $W_I = 8$ has been chosen to fully cover the GSM/EDGE and partial WCDMA band frequency range of $f_V = 1,600$-$2,000$ MHz with an arbitrary reference frequency $f_R \geqq 8$ MHz.

The ADPLL operates in a digitally-synchronous fixed-point phase domain as follows: The variable phase accumulator 156 determines the variable phase $R_V[i]$ by counting the number of rising clock transitions of the DCO oscillator clock CKV as expressed below.

$$R_V[i] = \sum_{l=0}^{i} 1 \tag{5}$$

The index i indicates the DCO edge activity. The variable phase $R_V[i]$ is sampled via sampler 158 to yield sampled FREF variable phase $R_V[k]$, where k is the index of the FREF edge activity. The sampled FREF variable phase $R_V[k]$ is fixed-point concatenated with the normalized time-to-digital verter (TDC) 162 output $\epsilon[k]$. The TDC measures and quantizes the time differences between the frequency reference FREF and the DCO clock edges. The sampled differentiated (via block 160) variable phase is subtracted from the frequency command word (FCW) by the digital frequency detector 138. The frequency error $f_E[k]$ samples $$f_E[k] = FCW - [(R_V[k] - \epsilon[k]) - (R_V[k-1] - \epsilon[k-1])] \tag{6}$$

are accumulated via the frequency error accumulator 140 to create the phase error $\phi_E[k]$ samples $$\phi_E[k] = \sum_{l=0}^{k} f_E[k] \quad (7)$$

which are then filtered by a fourth order IIR loop filter 142 and scaled by a proportional loop attenuator α. A parallel feed with coefficient ρ adds an integrated term to create type-II loop characteristics which suppress the DCO flicker noise.

It is noted that the CKV signal could be taken from either the DCO 148 output or the quadrature switch 149 output, as shown in FIG. 5. In the latter case, any phase jump at the quadrature switch 149, whether due to the modulation exception handling or due to the constant phase rotation for the purpose of avoiding the DCO frequency pulling, could be easily compensated for digitally in the frequency/phase detection part of the ADPLL. The compensation is needed in the ADPLL since the phase jumps due to modulation are occasional and are not intended to change the averaged oscillation frequency. For example, a +90 degree phase shift could be compensated for by subtracting +¼ from the epsilon (normalized output of the TDC) or the frequency detector output. The quadrature switch 149 phase jumps either might or might not be intended to change the frequency relationship of the ADPLL operation. For example, compensating for the constant phase rotation in quadrature switch 149, makes equal the actual DCO frequency and the variable frequency perceived by the ADPLL phase/frequency detection thereby preserving the FCW definition. Not performing that compensation requires adjustment to the definition of FCW. One of the disadvantages of operating a PLL circuit near or at an integer-N relationship between the reference frequency and the variable frequency is a performance degradation due to various coupling mechanisms (e.g., parasitic coupling of RF signal into the frequency reference input or slicer). The pulling effect could be avoided by avoiding the exact integer-N or near integer-N frequency relationship, which could be achieved by engaging or disengaging the phase jump compensation.

The IIR filter is a cascade of four single stage filters, each satisfying the following equation:

$$y[k] = (1-\lambda) \cdot y[k-1] + \lambda \cdot x[k] \quad (8)$$

wherein
 x[k] is the current input;
 y[k] is the current output;
 k is the time index;
 λ is the configurable coefficient;
The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 146, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 136 and 144. A hitless gear-shifting mechanism for the dynamic loop bandwidth control serves to reduce the settling time. It changes the loop attenuator a several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The frequency reference FREF is input to the retimer 166 and provides the clock for the TDC 162. The FREF input is resampled by the RF oscillator clock CKV via retimer block 166 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

Local Oscillator Exception Handling Mechanism

Figure 6:
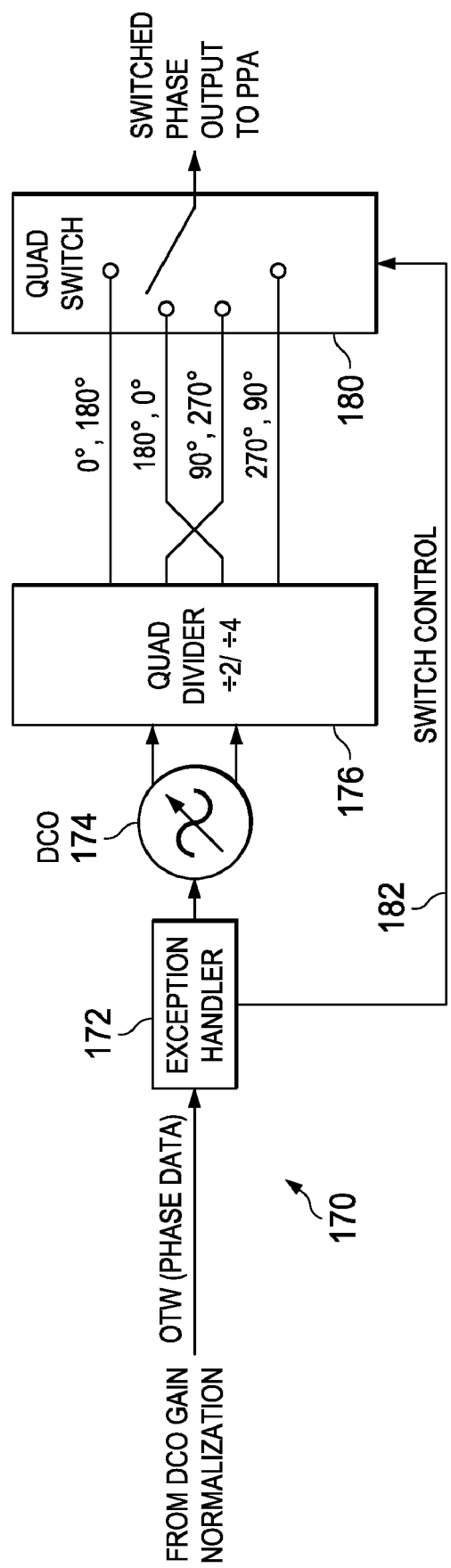
FIG. 6 is a block diagram illustrating an example embodiment of the LO exception handling mechanism of the present invention.

A block diagram illustrating an example embodiment of the LO exception handling mechanism of the present invention is shown in FIG. 6. The circuit, generally referenced 170, comprises an exception handler block 172, DCO 174, quadrature divide by two/four 176 and quadrature switch or multiplexer 180.

In operation, oscillator tuning word (OTW) (or frequency tuning word (FTW)) is input to the exception handler 172. The exception handler either passes the OTW through to the DCO or replaces it with a residue tuning command. The DCO generates an RF signal having a frequency in accordance with the output of the exception handler. Normally, the quad band DCO is modulated by the oscillator tuning word data stream to generate the phase (frequency) information for the DPPA. In this case, however, the OTW is input to the exception handler and the output of the exception handler is used to modulate the DCO. The DCO operates at twice (IMT2K, PCS, DCS) or four times (US-cellular, EU-cellular) the band frequency. This provides the needed tuning range to permit a single oscillator span all bands while providing acceptable phase noise. The output of the DCO is passed through a quadrature generating divider 176. Typical differential dividers provide a quadrature output by default wherein only a single phase pair is (i.e. 0 and 180 degrees) is sent to the next stage (i.e. the digital pre-power amplifier or DPPA).

In accordance with the present invention, the frequency divider is operative to output four quadrature phases. The four phases may comprise any desired phases, 0, 45, 90, etc. In the example embodiment presented herein, the four phase comprise 0/180 degrees (I+/I−) and 90/270 degrees (Q+/Q−). These four outputs of the divider are input to a fast quadrature switch that functions to select between four different quadrature phase pairs based on a switch control signal 182 generated and output of the exception handler 172. In the example embodiment presented herein, the four phase pairs comprise 0/180 degrees (I+/I−), 180/0 degrees (I−/I+), 90/270 degrees (Q+/Q−) and 270/90 degrees (Q−/Q+).

The switch is implemented by passing all four quadrature outputs of the divider through four switched inverter buffers in pairs that are 180 degrees out of phase with each other. Any phase combination can then be selected by either turning on or off any two of the inverter pairs. When the DCO is commanded to modulate beyond its range (as a result of the incoming WCDMA phase data stream), the quadrature switch is enabled and a discrete jump in phase (referred to as a phase jump) is activated. Typically, the phase jump is either +90 or −90 degrees, but in practice, the phase jump may comprise any desired amount of phase.

It is noted that the mechanism of the present invention can be combined with the constant phase rotation of the quadrature switch for the additional purpose of avoiding injection pulling. Advantageously, the quadrature switch hardware is commonly used. The phase shift requests, however, must be merged. For example, if the exception handling request stream (in degrees) is 0, 90, 0, 0, −90; and the rotation (in degrees) 0, 90, 180, 270, 0; then the combined phase request stream (in degrees) would be 0, 180, 180, 270, −90; It is appreciated that the high speed high RF performance multiplexer is advantageously reused, and only the switch select control portion needs modification. An embodiment combining the invention with the constant phase rotation of the quadrature switch is presented in connection with FIGS. 15 and 16 infra.

The remaining phase modulation is referred to as the residue (or correction) phase modulation and is defined as the difference between the requested phase (e.g., OTW or FTW) and the phase jump (e.g., 90 degrees). This residue phase modulation constitutes the modified or new frequency command that is input to the DCO. It is important to note that, the phase jump combined with the residue phase command (or correction), effectively results in the original frequency request (OTW or FTW). In addition, both the phase jump and the residue correction occur and are applied simultaneously thus resulting in the signal output of the quadrature switch to contain the full requested phase modulation. Thus, the error vector magnitude (EVM) specification is met and not degraded.

Note further that regardless of (1) which of the four quadrature phases is selected and (2) what the residue phase correction is required from the DCO, the end result is the originally required phase (i.e. OTW, FTW, etc.). In addition, the DCO phase movement requested by the residue command will always be within the modulation range of the DCO.

Figure 7:
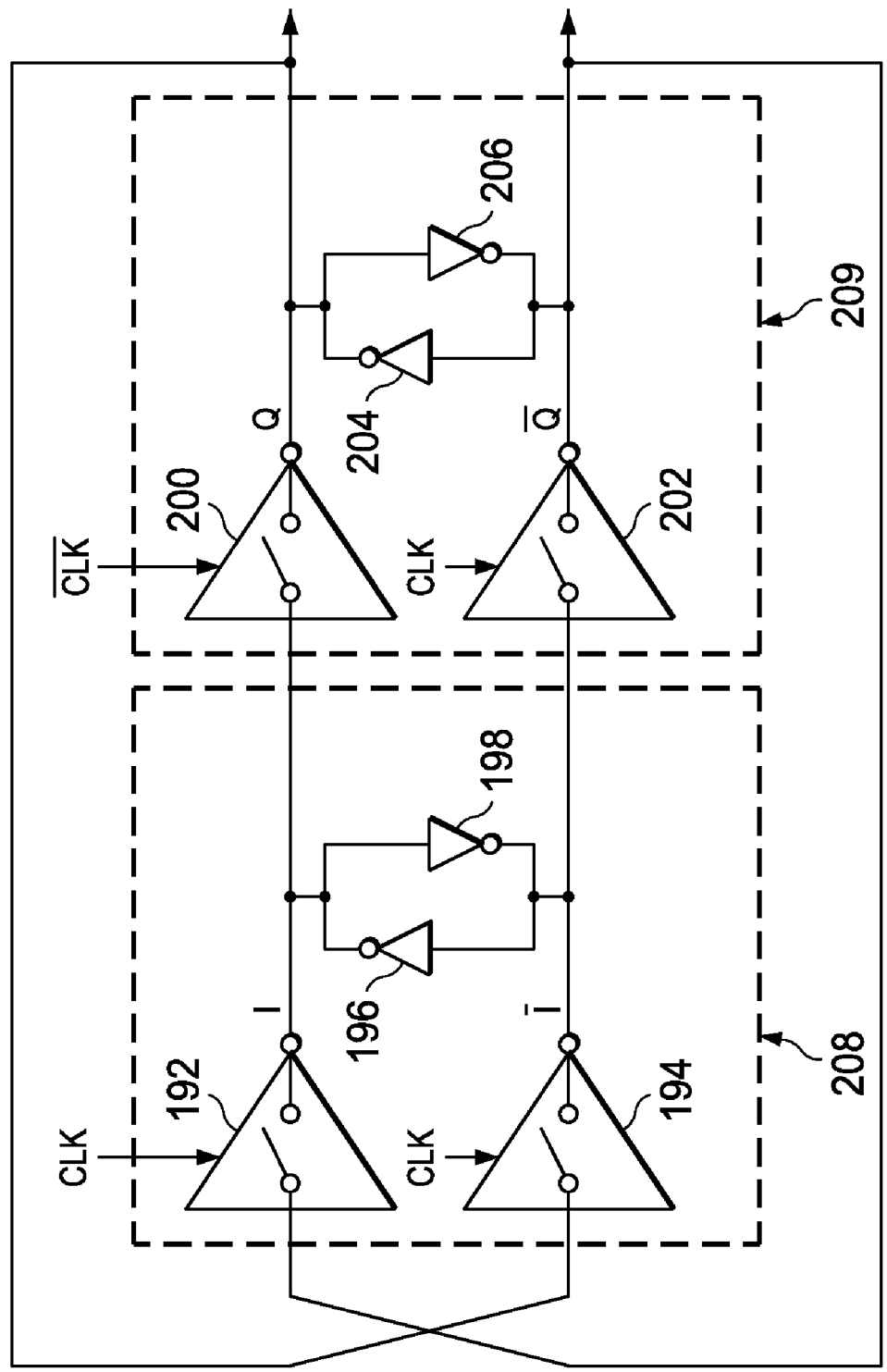
FIG. 7 is a block diagram illustrating an example single divide by two section of the divider of FIG. 6 in more detail.

A block diagram illustrating an example single divide by two section of the divider of FIG. 6 in more detail is shown in FIG. 7. The circuit, generally referenced 190, comprises switched inverters 192, 194, 200, 202 and inverters 196, 198, 204, 206.

In operation, the divider effectively operates as a ring oscillator clocked by the DCO. Latches 192 and 200 form one divider, while latches 194 and 202 form another divider, with the negated output of each fed back to the respective input. Latches 194 and 202 (or 192 and 200) are duplicated for differential operation whereby the inversion is achieved by simply cross feeding the differential outputs to the inputs. The anti-parallel connected weak inverters 196, 198, 204, 206 at each differential latch output are added to maintain good common mode rejection. At any given time, two of the latches 192 and 194 (or 202 and 200) are on, passing the signal from their respective input to their output, while two of the latches 204 and 206 (or 192 and 194) are off, holding the value that is already present on their outputs. In the subsequent DCO clock cycle, the latches switch their roles. This allows for division by two while having outputs that are 90 degree phase shifted from each other.

Figure 8:
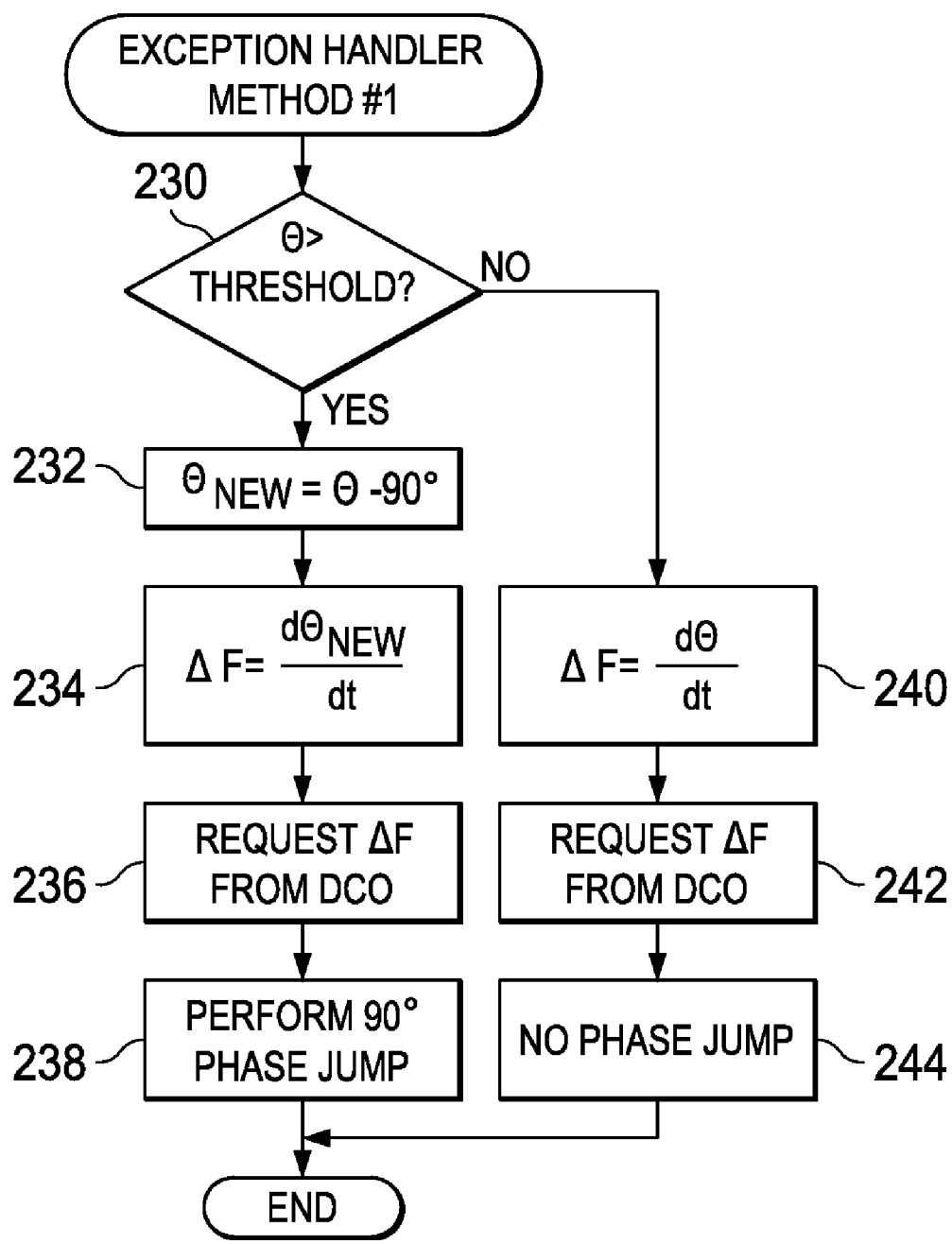
FIG. 8 is a flow diagram illustrating a first exception handling method of the present invention.

To aid in understanding the principles of operation of the exception handler and quadrature switch is a flow diagram illustrating a first exception handling method of the present invention is shown in FIG. 8. In this method #1, a description of the operation of the exception handler for the case of a 90 degree only phase jump is presented. A phase range value is determined based upon the capacity of the DCO modulation range. A threshold value is then determined by dividing the range in half to yield a +/− value representing an increase or decrease in phase. Any incoming phase data is then compared with this threshold value. If the data is larger than the threshold value and smaller than 90 degrees, a 90 degree phase jump is requested from the quadrature switch while the residue (i.e. the phase difference or (θ−90 degrees)) is requested from the DCO. Note that in all cases, the total phase change is that which was originally required.

With reference to FIG. 8, the incoming requested phase data (OTW, FTW, etc.) is first compared with a threshold (step 230). In this case, the threshold is substantially equal to one-half the modulation range of the DCO. If the requested phase data exceeds the threshold it means that the requested phase data exceeds the modulation range of the oscillator (i.e. the DCO). In this case, a phase jump is required. The phase correction $\theta_{NEW}$ is calculated by subtracting 90 degrees from the original requested phase data (step 232). This is the residue phase to be requested from the DCO. The residue frequency request $\Delta F$ is calculated by taking the derivative of the residue phase correction (step 234). The residue frequency request is input to the DCO (step 236). Simultaneously, the phase jump of 90 degrees is performed by configuring the quadrature switch or multiplexer to select a 90 degree jump (step 238). Thus, if the switch was previously set to output the 0 and 180 degree phase pair, a 90 degree phase jump is performed by configuring the switch to select the 90 and 270 degree phase pair.

If the requested phase data does not exceed the threshold it means that the requested phase data does not exceed the modulation range of the oscillator (i.e. the DCO). In this case, no phase jump is required. The frequency request $\Delta F$ is calculated by taking the derivative of the original phase data (step 240). The frequency request is input to the DCO (step 242) without any phase jump performed (step 244).

Figure 9:
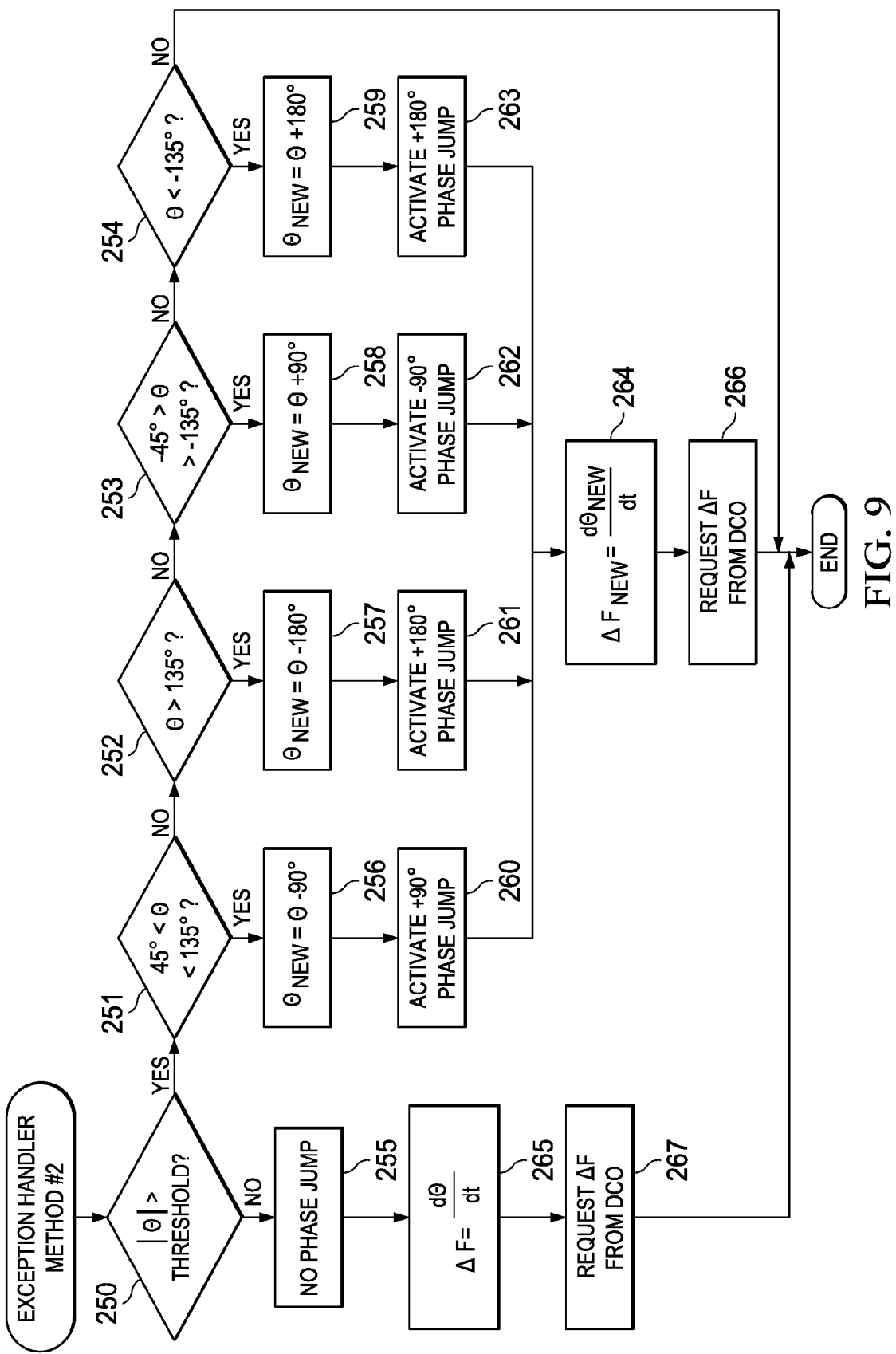
FIG. 9 is a flow diagram illustrating a second exception handling method of the present invention.

A flow diagram illustrating a second exception handling method of the present invention is shown in FIG. 9. In this general method, the threshold value is normalized to +/−45 degrees wherein the quadrature switch provides for +/−180 degree coverage. Thus, in all cases, the quadrature switch effectively quadruples the DCO modulation range.

The requested phase data is first compared to the threshold (step 250). If it does not exceed the threshold (i.e. the requested phase data does not exceed the modulation range of the DCO) the frequency request $\Delta F$ is calculated by taking the derivative of the original phase data (step 265). The frequency request is input to the DCO (step 267) without any phase jump performed (step 255).

If the requested phase data exceeds the threshold (step 250), then it is determined if the requested phase data is greater than 45 degrees and less than 135 degrees (step 251). If so, the phase correction $\theta_{NEW}$ is calculated by subtracting 90 degrees from the original requested phase data (step 256). This is the residue phase to be requested from the DCO. A +90 degree phase jump is activated by configuring the quadrature switch to select a +90 degree phase jump (step 260). The residue frequency request $\Delta F_{NEW}$ is calculated by taking the derivative of the residue phase correction (step 264). The residue frequency request $\Delta F_{NEW}$ is then requested from the DCO (step 266).

If it is determined that the requested phase data is not greater than 45 degrees and less than 135 degrees (step 251), it is checked whether it is greater than 135 degrees (step 252). If so, the phase correction $\theta_{NEW}$ is calculated by subtracting 180 degrees from the original requested phase data (step 257). This is the residue phase to be requested from the DCO. A +180 degree phase jump is activated by configuring the quadrature switch to select a +180 degree phase jump (step 261). The residue frequency request $\Delta F_{NEW}$ is then calculated (step 264) and requested from the DCO (step 266).

If it is determined that the requested phase data is not greater than 135 degrees (step 252), it is checked whether it is less than −45 degrees and greater than −135 degrees (step 253). If so, the phase correction $\theta_{NEW}$ is calculated by adding 90 degrees to the original requested phase data (step 258). This is the residue phase to be requested from the DCO. A −90 degree phase jump is activated by configuring the quadrature switch to select a −90 degree phase jump (step 262). The residue frequency request $\Delta F_{NEW}$ is then calculated (step 264) and requested from the DCO (step 266).

If it is determined that the requested phase data is not less than −45 degrees and greater than −135 degrees (step 253), it is checked whether it is less than −135 degrees (step 254). If so, the phase correction $\theta_{NEW}$ is calculated by adding 180 degrees to the original requested phase data (step 259). This is the residue phase to be requested from the DCO. A 180 degree phase jump is activated by configuring the quadrature switch to select a 180 degree phase jump (step 263). Note that the quadrature switch as shown in FIG. 6 provides for a +180 degree phase jump option. Since a −180 degree phase jump is equivalent to a +180 degree phase jump, the method does not need modification. The residue frequency request $\Delta F_{NEW}$ is then calculated (step 264) and requested from the DCO (step 266).

Figure 10:
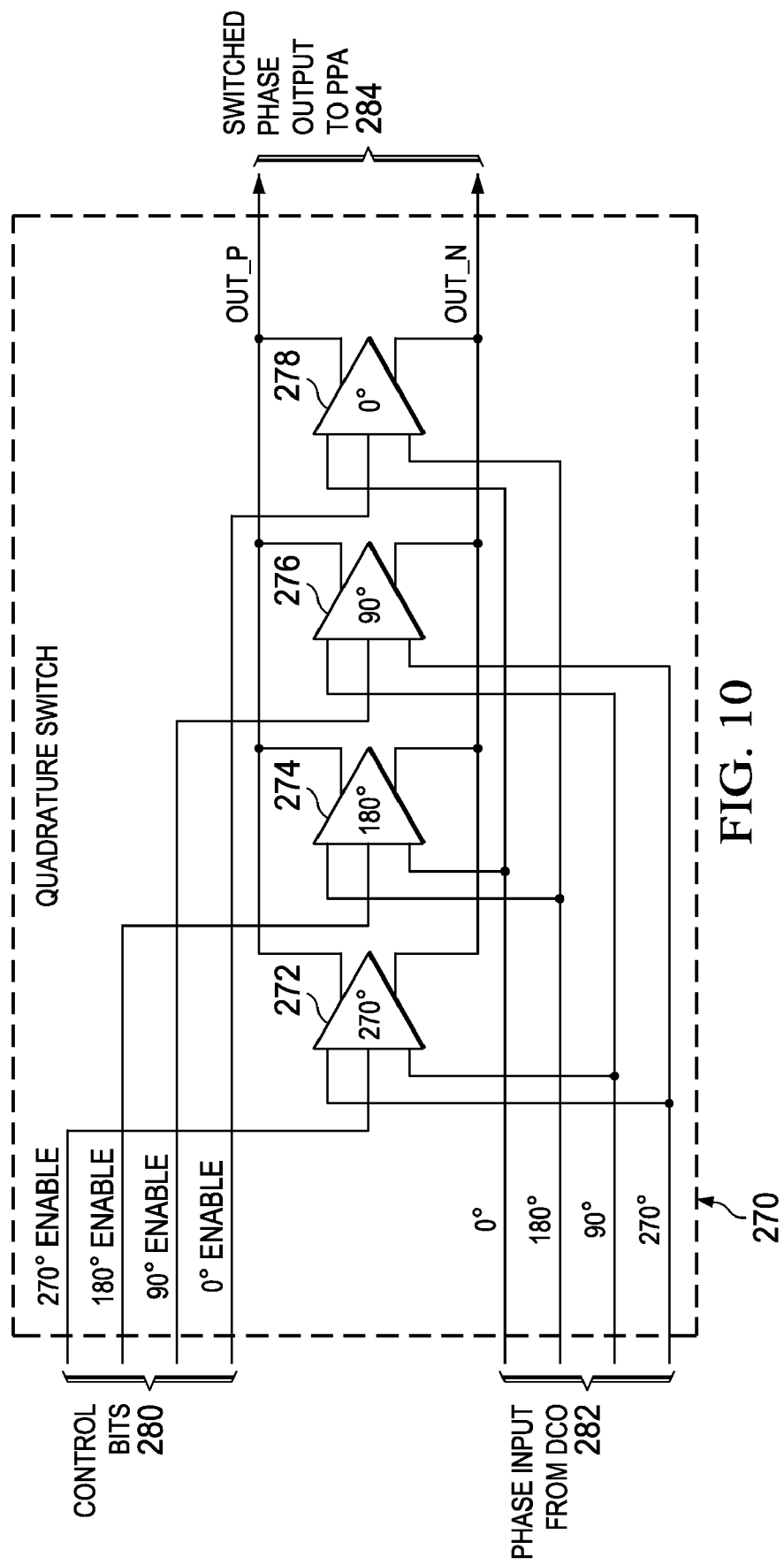
FIG. 10 is a block diagram illustrating the quadrature switch of FIG. 6 in more detail.

A block diagram illustrating the quadrature switch of FIG. 6 in more detail is shown in FIG. 10. The quadrature switch, generally referenced 270, comprises switched buffers 272, 274, 276 and 278. Each of the switched buffers controls a particular quadrature phase. In particular, switched buffer 272 represents the 270 degree phase; switched buffer 274 represents the 180 degree phase; switched buffer 276 represents the 90 degree phase; and switched buffer 278 represents the 0 degree phase.

In operation, control bits 280 for each the four phases are input to each of the switched buffers, respectively. The four control bits function as enable signals from each of the respective switched buffers. At any instant in time, only one of the four control bits is active thereby permitting only one of the four switched buffers to be active. The four quadrature phase inputs 282 from the DCO are applied in pairs to each of the switched buffers. Phases 90 and 270 are input to the 270 degree (equivalent to −90 degree) switched buffer. Phases 180 and 0 are input to the 180 degree (equivalent to −180 degree) switched buffer. Phases 90 and 270 are input to the 90 degree switched buffer. Phases 0 and 180 are input to the 0 degree switched buffer. Within each phase pair, the phase that is 180 degrees offset from the first phase is used to generate the differential output 284 comprising signals OUT_P and OUT_N.

Figure 11:
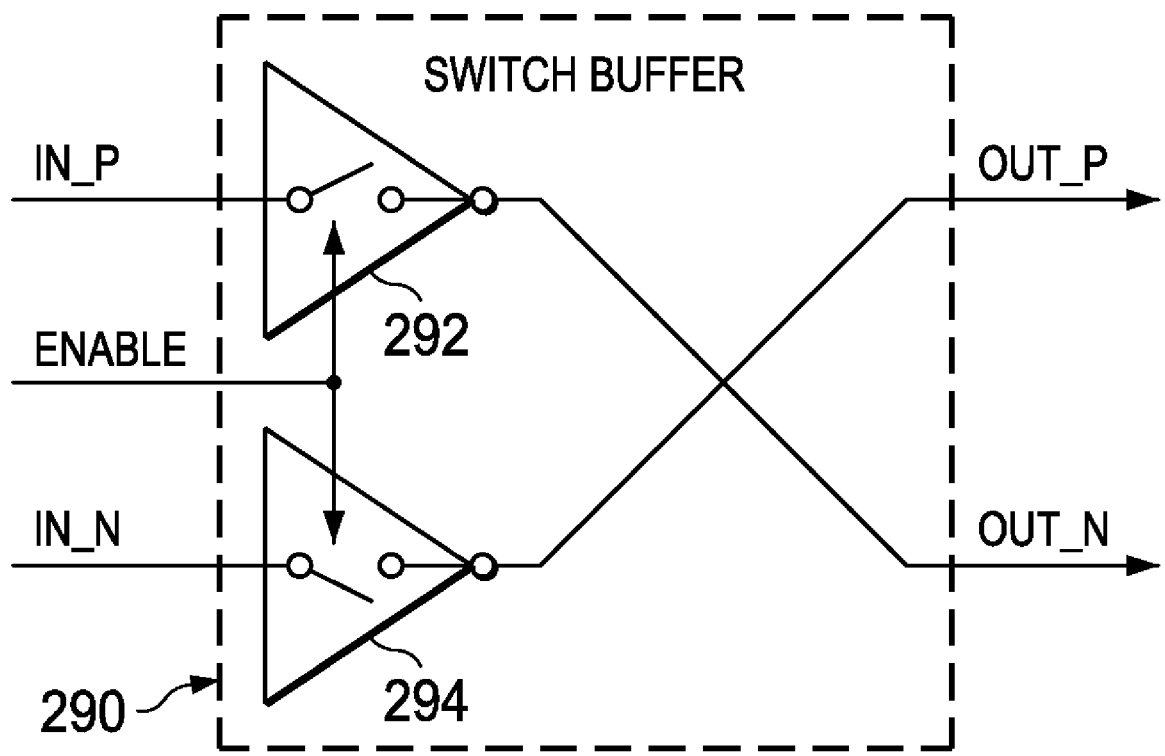
FIG. 11 is a block diagram illustrating the switch buffer of FIG. 10 in more detail.

A block diagram illustrating the switch buffer of FIG. 10 in more detail is shown in FIG. 11. The switched buffer, generally referenced 290, comprises a switched inverter pair 292 and 294. Each of the four differential switched inverter buffers of FIG. 10 comprise two identical buffers as shown. In operation, the enable signal is applied to switched inverters 292, 294. When enabled, the input signals IN_P, IN_N are inverted and crossed on output to yield the OUT_P and OUT_N signal, respectively. The outputs of the buffers are swapped to maintain the correct phase polarity since passage of the signal through either of the two buffers introduces a 180 degree phase inversion.

Figure 12:
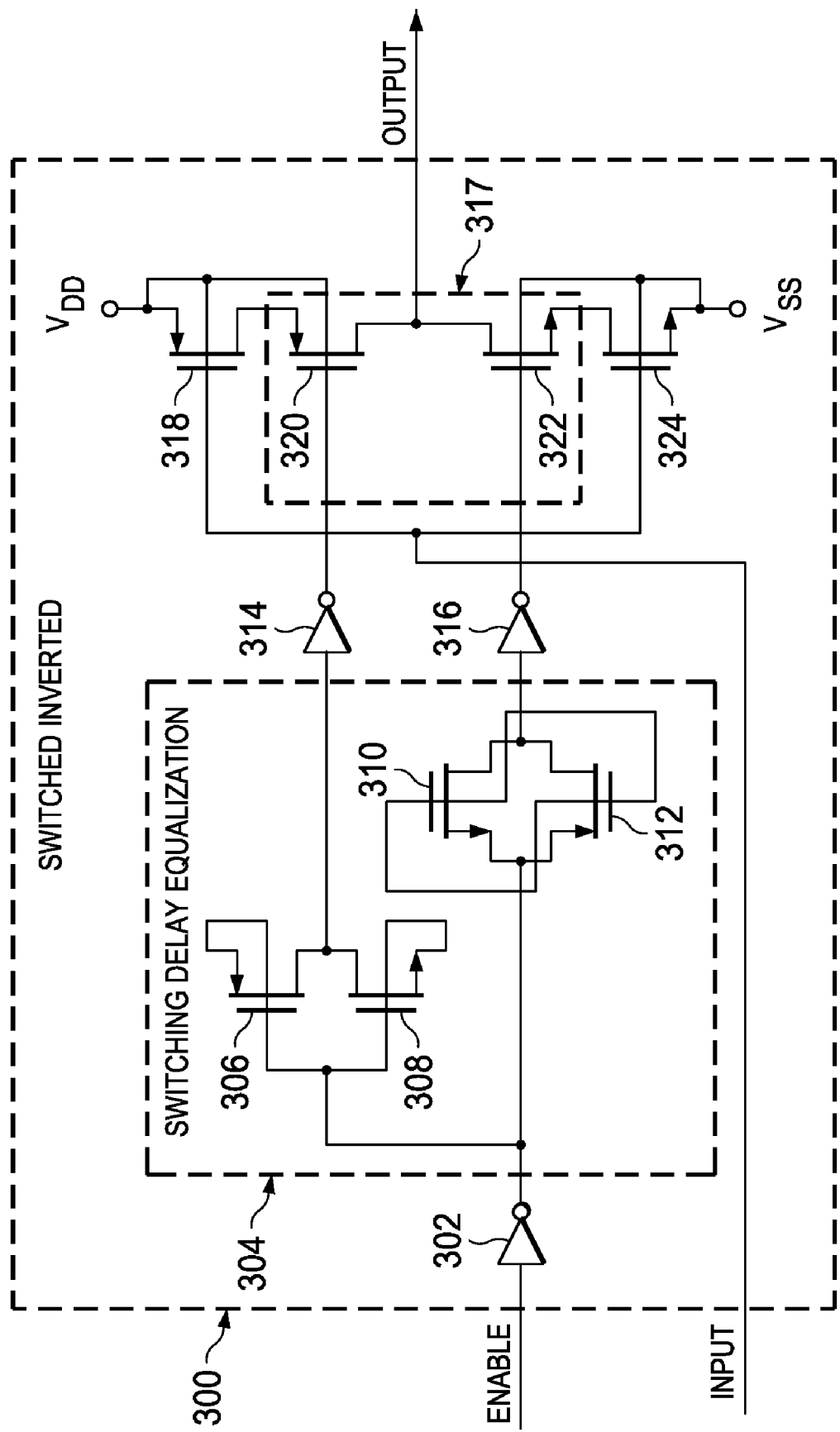
FIG. 12 is a block diagram illustrating one of the switched inverters of FIG. 11 in more detail.

A block diagram illustrating one of the switched inverters of FIG. 11 in more detail is shown in FIG. 12. The switched inverter, generally referenced 300, comprises inverters 302, 314, 316, switching delay equalization circuit and output FETs 318, 320, 322, 324. The switching delay equalization circuit comprises FETs 306, 308, 310, 312.

In operation, each individual buffer comprises an inverter with a switch 317 in the middle. When the switch is on, the inverter outputs a 180° shifted replica of the input. When the switch is off, the inverter does not output a signal. The switch is controlled by an inverting switch control signal and a non-inverting switch control signal generated from single enable signal input to the buffer. Since the switch comprises both NMOS and PMOS transistors, an inverted copy of the enable signal is created and both enable signals are simultaneously applied to the switch. This is accomplished by using a pass gate (i.e. transistors 310, 312) in one path to mimic the inverter delay (i.e. transistors 306, 308) in the second path. Synchronization of the switch is critical in accomplishing fast switching. Note that the delay equalization 304 is not in the signal path and thus has a negligible effect on phase noise.

A key advantage of the invention is that the signal only needs to pass through one additional buffer stage (considering the DRP application of the invention) in order to implement quadrature switching. This is because these buffers are already in the signal path in order to drive the large capacitive load of the DPPA. Thus, only the switch circuitry portion 317 (FIG. 12) need be added to the signal path for a given set of outputs. This minimizes the impact of phase noise while providing for a highly efficient implementation of the quadrature switch.

Figure 13:
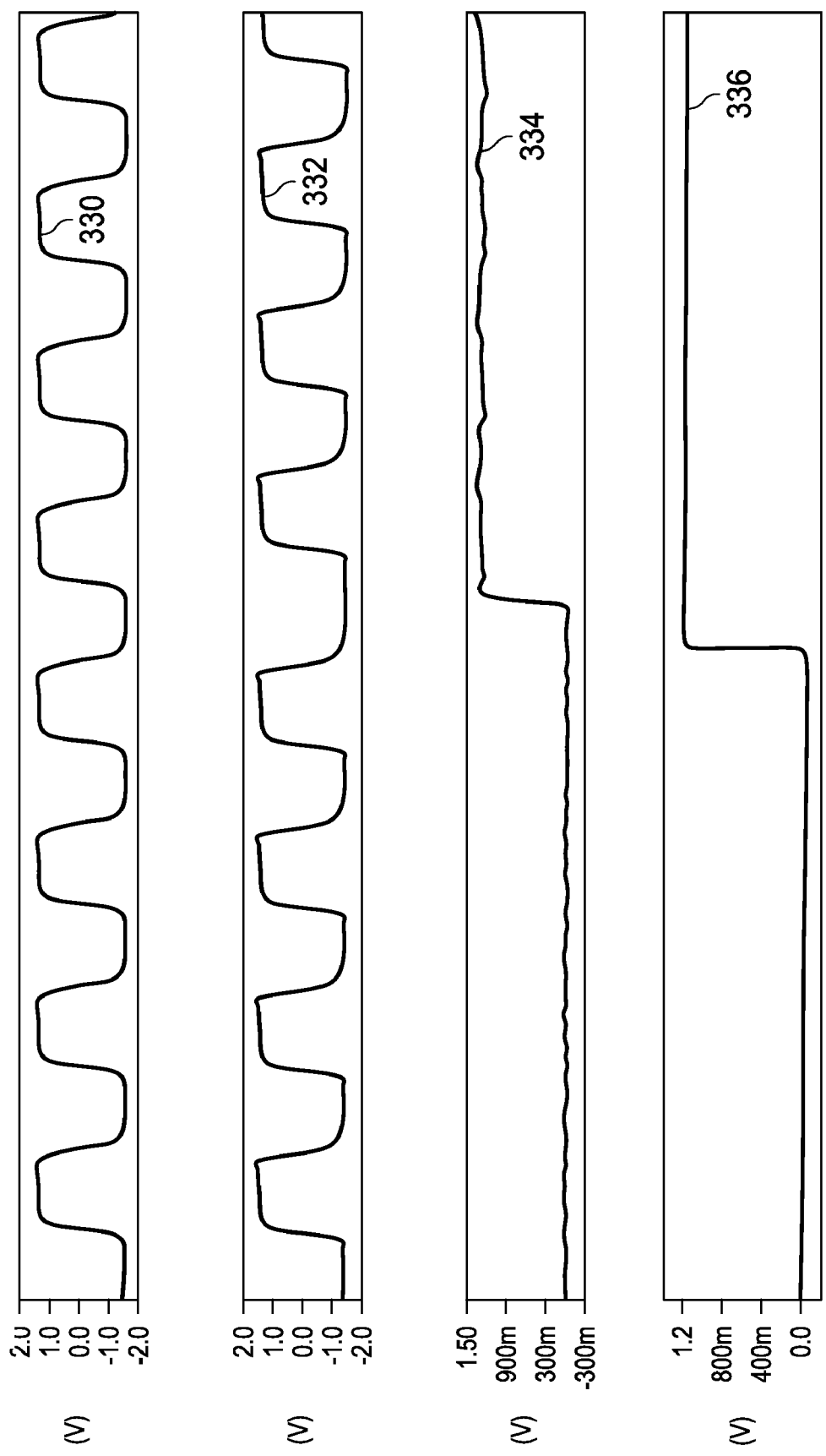
FIG. 13 is a graph illustrating the quadrature switch output at the moment of a phase jump.

A graph illustrating the quadrature switch output at the moment of a phase jump is shown in FIG. 13. The operation of the quadrature switch for a 90 degree phase jump is shown in the figure. Trace 330 represents the output of the quadrature switch without any phase jump. Trace 332 represents the output of the quadrature switch before and after a 90 degree phase jump. Trace 334 represents the activation of the phase jump by the quadrature switch. The phase jump command is given at 6 ns as indicated in trace 336. Note that there is a short propagation delay (fraction of a nanosecond) before the quadrature switch actually receives the command. At the time of activation, the output of the quadrature switch is shifted by 90 degrees as shown in trace 332.

Figure 14:
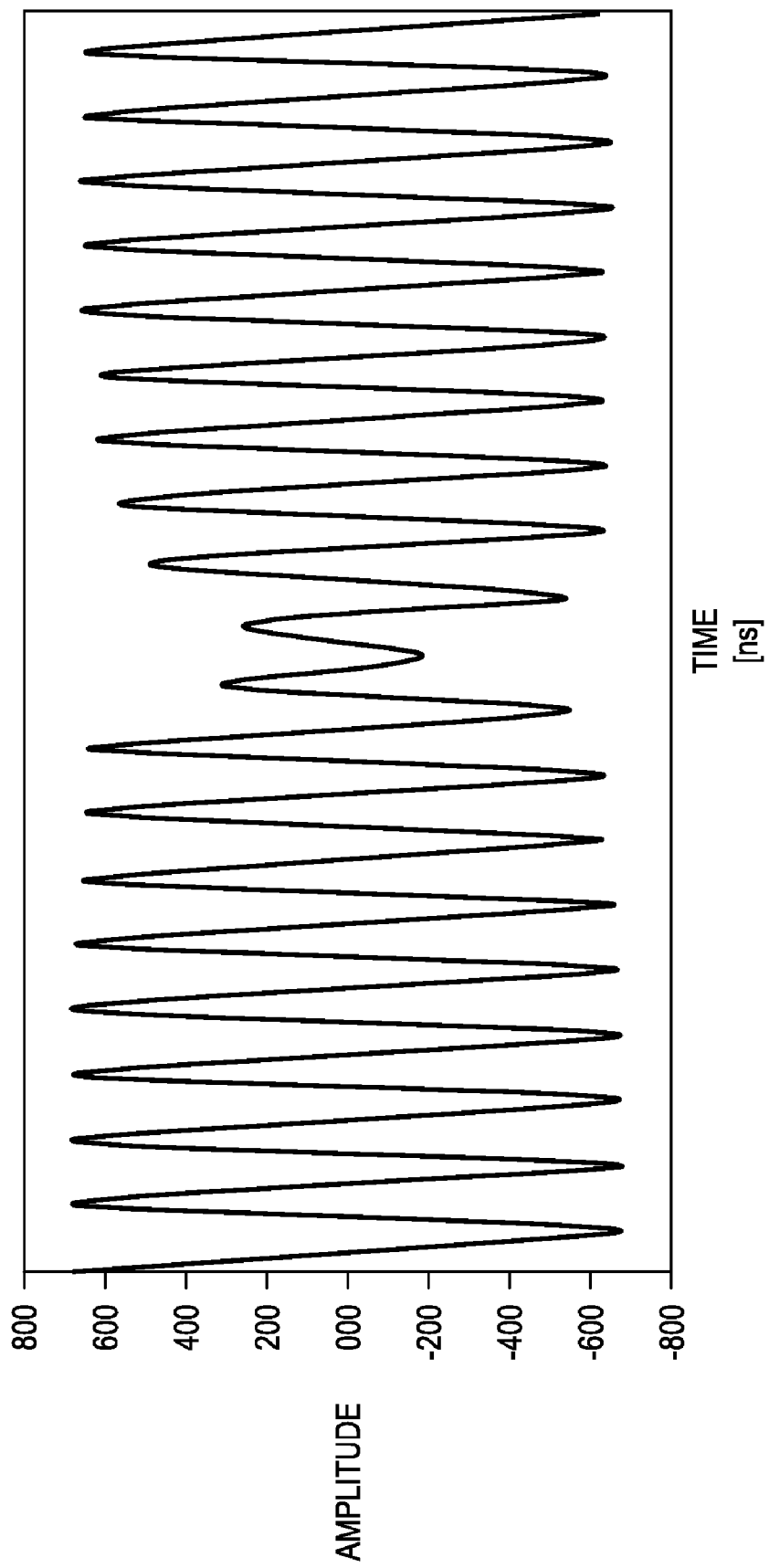
FIG. 14 is a graph illustrating a time domain measurement of the output of the quadrature switch at the moment the switch is activated.

A graph illustrating a time domain measurement of the output of the quadrature switch at the moment the switch is activated is shown in FIG. 14.

Figure 15:
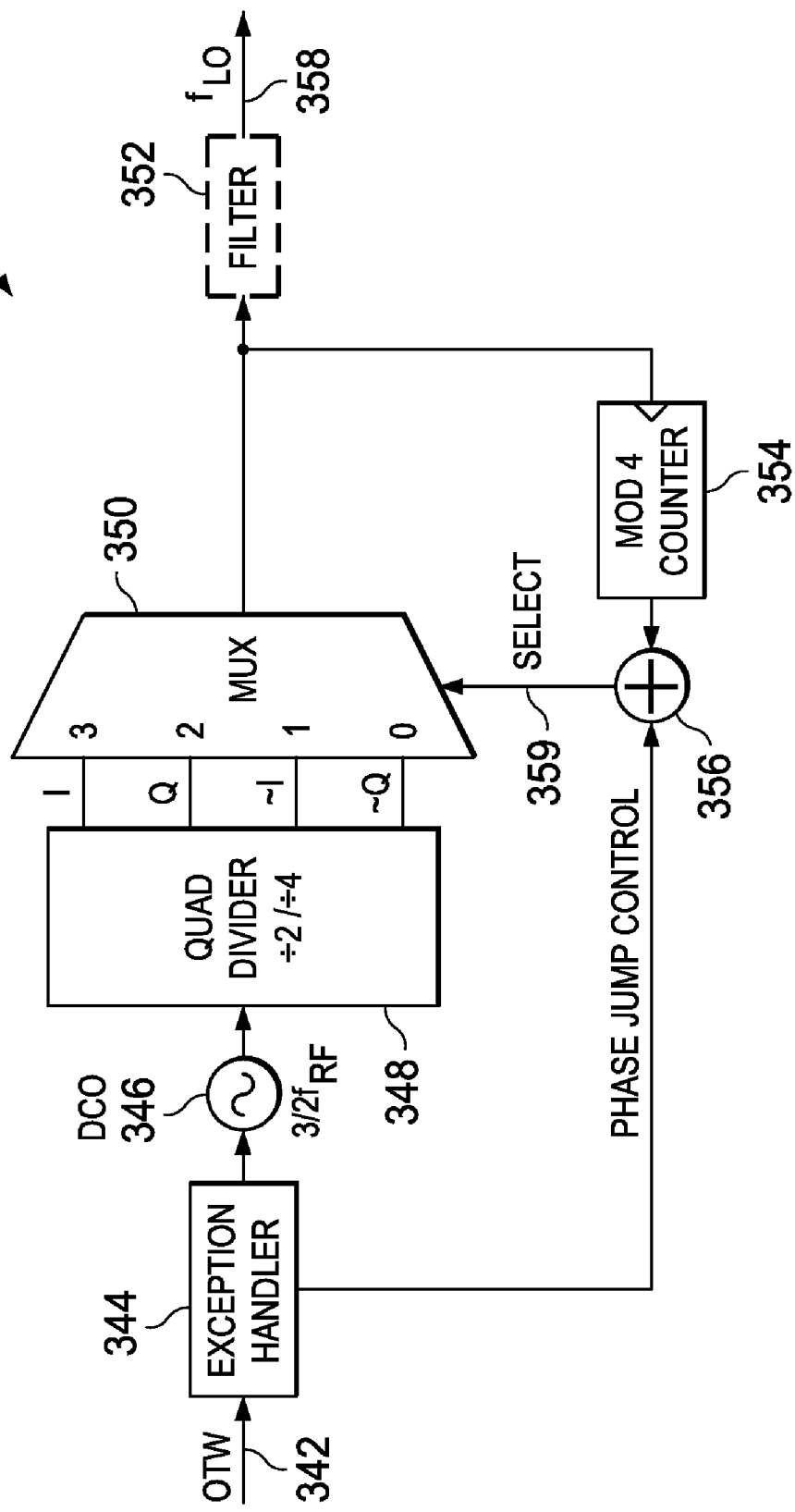
FIG. 15. is a block diagram illustrating an embodiment incorporating the exception handling mechanism of the present invention in a local oscillator generator with the constant phase rotation.

A block diagram illustrating an embodiment incorporating the exception handling mechanism of the present invention in a local oscillator generator with constant phase rotation is shown in FIG. 15. The circuit, generally referenced 340, comprises exception handler 344, frequency synthesizer oscillator (DCO) 346, frequency or edge divider 348, multiplexer 350, adder 356, counter 354 and optional filter 352. The operation of this circuit (with the exception handler 344 de-asserted) is described in more detail in U.S. application Ser. No. 11/844,453, filed Aug. 24, 2007, entitled "Local Oscillator With Non-Harmonic Ratio Between Oscillator And RF Frequencies Using Pulse Generation And Selection," incorporated herein by reference in its entirety.

In operation, the OTW 342 is input to the exception handler which is operative to implement the exception handling mechanism of the present invention described in detail supra. The phase residue output of the exception handler is input to the frequency synthesizer 346 running at 3/2 $f_{RF}$. The signal frequency output of the synthesizer is divided by two (or four) via divider circuit 348 which has four phase outputs, namely, the quadrature pair I and Q and their inverses ~I and ~Q. The four phases are input to a multiplexer 350 which functions to output the desired local oscillator signal.

In this embodiment, two control signals determine which phase is output of the multiplexer at any point in time. One control signal is the output of the modulo-4 counter 354 and the second is the phase jump control signal output of the exception handler. The two control signals are combined via modulo (i.e. overflow with wrap-around) adder 356. The output of the adder 359 serves as the select input to the multiplexer. The counter is clocked by the local oscillator output signal 358 (or the DCO 346 output or one of the phases of the quadrature divider 348) and its output is input to the adder. An optional filter 352 attenuates any unwanted frequency spurs. Note that the modulo-4 counter is adapted to be disabled or disabled depending on the desire to avoid or to tolerate injection pulling of the DCO by the RF output. The modulo-4 counter can also be adapted to be enabled depending on the output frequency. For example, if there is a strong coupling between the RF output into the frequency reference input of the frequency synthesizer at integer-N frequency relationship, the modulo-4 counter can be enable to achieve a frequency offset.

It is noted that, in an alternative embodiment, the selecting input 359 is advantageously driven by one of the four phases of the output of divider 348. Driving a multiplexer selecting input by a signal that does not depend on the multiplexer output can be considered beneficial as it provides for more reliable operation.

A timing diagram illustrating the various time domain traces for the local oscillator generator shown in FIG. 15 is shown in FIG. 16. In the example, the exception handler is not active. The timing diagram shows the various time domain traces for the signals of the circuit 340 of FIG. 15. Traces 360, 362, 364 and 366 represent the four phases (i.e. ~Q, ~I, Q and I), respectively. The thick lines in the traces represent the portions which are multiplexed to the output via multiplexer 350. Trace 368 represents the output of the counter 354. Trace 370 represents the output waveform $f_{LO}$ 358. As can be seen, notwithstanding a duty cycle aberration, the output waveform is a perfect signal at $f_{RF}$. Any activity on the exception handler would add (in the modulo manner) to the selected phase.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An apparatus for generating polar modulation, comprising:
   an oscillator operative to generate a radio frequency (RF) signal having quadrature phases in accordance with a residue tuning command;
   exception handling means coupled to said oscillator and operative to generate said residue tuning command and a phase jump in accordance with a frequency deviation request; and
   four switched inverter buffers, each switched inverter buffer coupled to one of said quadrature phases and operative to output one of said quadrature phases in accordance with said phase jump.

2. The apparatus according to claim 1, wherein each differential switched inverter buffer comprises two inverter buffers coupled to a respective differential quadrature phase.

3. The apparatus according to claim 1, wherein each inverter buffer comprises:
   switch control means for generating an inverting and non-inverting switch control signal from an enable signal input thereto, wherein inverting switch control signal is synchronized with said non-inverting switch control signal; and
   a differential switch having an inverting input for receiving said inverting switch control signal and a non-inverting control input for receiving said non-inverting switch control signal, said switch operative to output a inverted version of an input signal in accordance with said inverting switching control signal and said non-inverting switch control signal.

4. The apparatus according to claim 1, wherein said switch control means comprises:
   an inverter operative to generate said inverting switch control signal comprising an inverted version of said enable signal; and
   a pass gate circuit operative to generate said non-inverting switch control signal to incorporate switching delay equalization of said inverting switch control signal.

5. An apparatus for generating polar modulation, comprising:
   an oscillator operative to generate a radio frequency (RF) signal having a plurality of phases in accordance with a residue tuning command;
   exception handling means coupled to said oscillator and operative to generate said residue tuning command and a phase jump in accordance with a frequency deviation request; and
   a switch for receiving said plurality of phases and operative to output one of said phases in accordance with said phase jump.

6. The apparatus according to claim 5, wherein said switch comprises a plurality of differential switched inverter buffers, each differential switched inverter buffer coupled to one of said plurality of phases and operative to enable one of said differential switched inverter buffers at any time in accordance with said phase jump.

7. The apparatus according to claim 5, wherein said oscillator comprises a digitally controlled oscillator.

8. The apparatus according to claim 5, wherein said plurality of phases comprise 0, 90, 180 and 270 degrees.

9. The apparatus according to claim 5, wherein said switch is operative to switch between said plurality of phases comprising four differential phase pairs of 0, 180 degrees, 180, 0 degrees, 90, 270 degrees, and 270, 90 degrees.

10. The apparatus according to claim 5, wherein said exception means is operative to generate said phase jump if said frequency deviation request is greater than a threshold.

11. The apparatus according to claim 5, wherein said threshold is substantially equal to one-half of an effective tuning range of said oscillator.

12. The apparatus according to claim 5, wherein said exception means is operative to generate said phase jump if said frequency deviation command is greater than an effective tuning range of said oscillator.

13. The apparatus according to claim 5, wherein said exception means is operative to request an oscillator phase movement within the modulation capacity thereof.

14. The apparatus according to claim 5, wherein said residue tuning command is substantially equivalent to said phase deviation request minus 90 degrees.

15. The apparatus according to claim 5, wherein the combination of said phase jump and said residue tuning command results in the original frequency deviation request.

16. The apparatus according to claim 5, further comprising means for performing a rotation of said switch output.

17. A method of polar modulation, said method comprising the steps of:
   first generating a phase jump and corresponding residue frequency deviation command if a frequency deviation request exceeds a threshold;
   second generating a radio frequency (RF) signal having an output frequency with a plurality of phases in response to said residue frequency deviation command; and selecting one of said phases in accordance with said phase jump.

18. The method according to claim 17, wherein said plurality of phases comprise 0, 90, 180 and 270 degrees.

19. The method according to claim 17, wherein said step of selecting comprises switching between said plurality of phases comprising four differential phase pairs of 0, 180 degrees, 180, 0 degrees, 90, 270 degrees, and 270, 90 degrees.

20. The method according to claim 17, wherein said threshold is substantially equal to one-half of an effective tuning range of an oscillator.

21. The method according to claim 17, wherein said residue frequency deviation command is substantially equivalent to said phase deviation request minus 90 degrees.

22. The method according to claim 17, wherein a combination of said phase jump and said residue frequency deviation command results in the original frequency deviation request.

23. The method according to claim 17, wherein said step of selecting further comprises performing a rotation among said plurality of phases.

24. A method of polar modulation, said method comprising the steps of:
receiving I and Q input signals representing data to be transmitted;
first generating a frequency command and an amplitude command in response to said I and Q input signals;
determining a metric as a function of said frequency command or said amplitude command;
second generating a residue tuning command and a phase jump if said metric exceeds said threshold;
providing a frequency synthesizer operative to generate a plurality of phase RF signal having a frequency in accordance with said residue tuning command; and
selecting one of said phases as an output signal in accordance with said phase jump.

25. The method according to claim 24, wherein said plurality of phases comprise 0, 90, 180 and 270 degrees.

26. The method according to claim 24, wherein said step of selecting comprises switching between said plurality of phases comprising four differential phase pairs of 0, 180 degrees, 180, 0 degrees, 90, 270 degrees, and 270, 90 degrees.

27. The method according to claim 24, wherein said threshold is substantially equal to one-half of an effective tuning range of a digitally controlled oscillator.

28. The method according to claim 24, wherein said residue tuning command is substantially equivalent to said phase command minus 90 degrees.

29. The method according to claim 24, wherein a combination of said phase jump and said residue tuning command results in the original frequency command.

30. The method according to claim 24, wherein said step of selecting further comprises performing rotation among said plurality of phases.

31. The method according to claim 24, wherein said step of selecting further comprises performing an additional phase jump on every cycle of said RF signal.

32. A polar radio frequency (RF) transmitter, comprising:
means for generating a frequency command and an amplitude command in response to I and Q input signals representing data to be transmitted;
an exception handler operative to generate a residue frequency command and a phase jump in accordance with said frequency command;
a frequency synthesizer operative to generate an RF signal comprising quadrature phases and having a frequency in accordance with said residue frequency command and a frequency reference input;
a switch for receiving said quadrature phases and operative to output one of said quadrature phases in accordance with said phase jump; and
a digital power amplifier (DPA) operative to receive said single quadrature phase output of said switch and to generate a modulated RF output signal in proportion to said amplitude code.

33. The transmitter according to claim 32, wherein said quadrature phases comprises 0, 90, 180 and 270 degrees.

34. The transmitter according to claim 32, wherein said switch is operative to switch between quadrature phases comprising four differential phase pairs of 0, 180 degrees, 180, 0 degrees, 90, 270 degrees, and 270, 90 degrees.

35. The transmitter according to claim 32, wherein said exception means is operative to generate said phase jump if said frequency deviation request is greater than a threshold.

36. The transmitter according to claim 32, wherein said threshold is substantially equal to one-half the tuning range of said oscillator.

37. The transmitter according to claim 32, wherein said exception means is operative to generate said phase jump if said frequency command is greater than the tuning range of said oscillator.

38. The transmitter according to claim 32, wherein said residue frequency command is substantially equal to said frequency command minus 90 degrees.

39. The transmitter according to claim 32, wherein the combination of said phase jump and said residue frequency command results in the original frequency command.

40. The transmitter according to claim 32, wherein said switch is adapted to cycle through said quadrature phases.

41. A radio, comprising:
a transmitter, said transmitter comprising:
an oscillator operative to generate a radio frequency (RF) signal in accordance with a residue tuning command, said RF signal comprising a plurality of phases;
exception handling means coupled to said oscillator and operative to generate said residue tuning command and a phase jump in accordance with a frequency deviation request;
a switch for receiving said plurality of phases and operative to output one of said multiple phases in accordance with said phase jump;
a receiver; and
a baseband processor coupled to said transmitter and said receiver.

42. The apparatus according to claim 41, wherein said transmitter comprises a polar transmitter.

43. The apparatus according to claim 41, wherein said oscillator comprises a digitally controlled oscillator (DCO).

44. The apparatus according to claim 43, wherein said DCO is updated at a sampling rate of $F_s$.

45. The apparatus according to claim 44, wherein said residue tuning command is substantially equal to said frequency deviation request minus said sampling rate $F_s$ divided by a number of said multiple phases.

46. The apparatus according to claim 41, wherein said plurality of phases comprise 0, 90, 180 and 270 degrees.

47. The apparatus according to claim 41, wherein said switch is operative to switch between four phases comprising four differential phase pairs of 0, 180 degrees, 180, 0 degrees, 90, 270 degrees, and 270, 90 degrees.

48. The apparatus according to claim 41, wherein said exception handling means is operative to generate said phase jump if said frequency deviation request is greater than a threshold.

49. The apparatus according to claim 41, wherein said threshold is substantially equal to one-half the tuning range of said oscillator.

50. The apparatus according to claim 41, wherein said switch is adapted to cycle through said quadrature phases.

51. A method of polar modulation for use in a transmitter comprising an oscillator generating a radio frequency (RF) signal having M phases, said method comprising the steps of:
   activating a phase jump when said oscillator is commanded to modulate beyond its effective range; and
   requesting a residue phase modulation from said oscillator.

52. The method according to claim 51, wherein said phase jump comprises 90 or more degrees.

53. The method according to claim 51, wherein said residue phase modulation is determined by subtracting said phase jump from said command to modulate.

54. The method according to claim 51, wherein said transmitter comprises a polar transmitter.

55. The method according to claim 51, wherein said oscillator comprises a digitally controlled oscillator (DCO).

56. The method according to claim 55, wherein said DCO is updated at a sampling rate of $F_s$.

57. An apparatus for generating polar modulation, comprising:
   an oscillator operative to generate a quadrature clock having an output frequency in accordance with an oscillator input;
   a multiplexer coupled to receive said quadrature clock and operative to output one of phases of said quadrature clock as an output signal in accordance with a select control input;
   exception handling means operative to generate a residue tuning command coupled to said oscillator input and to generate a phase jump control signal in accordance with a frequency deviation request;
   a modulo-4 counter operative to generate a counter output, wherein said counter output adapted to cause said multiplexer to cycle through said phases of said quadrature clock; and
   means for combining said phase jump control signal and said counter output to generate said select control input therefrom.

58. The apparatus according to claim 57, wherein said modulo-4 counter is adapted to be disabled depending on amount of pulling of said oscillator by output of said apparatus.

* * * * *